(12) United States Patent
Suzuki et al.

(10) Patent No.: US 11,187,579 B2
(45) Date of Patent: Nov. 30, 2021

(54) OPTICAL DEVICE

(71) Applicant: HAMAMATSU PHOTONICS K.K., Hamamatsu (JP)

(72) Inventors: Tomofumi Suzuki, Hamamatsu (JP); Kyosuke Kotani, Hamamatsu (JP); Tatsuya Sugimoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 173 days.

(21) Appl. No.: 16/619,630

(22) PCT Filed: Jul. 6, 2018

(86) PCT No.: PCT/JP2018/025645
§ 371 (c)(1),
(2) Date: Dec. 5, 2019

(87) PCT Pub. No.: WO2019/009402
PCT Pub. Date: Jan. 10, 2019

(65) Prior Publication Data
US 2020/0142155 A1    May 7, 2020

(30) Foreign Application Priority Data

Jul. 6, 2017 (JP) .............................. JP2017-133089

(51) Int. Cl.
*G02B 26/08* (2006.01)
*G01J 3/14* (2006.01)
(Continued)

(52) U.S. Cl.
CPC .................. *G01J 3/14* (2013.01); *B81B 3/00* (2013.01); *B81B 3/007* (2013.01); *B81B 3/0021* (2013.01);
(Continued)

(58) Field of Classification Search
CPC .. G01J 3/14; G01J 3/021; G01J 3/0237; G01J 3/108; G01J 3/45; G01J 3/4532;
(Continued)

(56) References Cited

U.S. PATENT DOCUMENTS 5,585,922 A    12/1996  Sueyoshi
5,870,221 A    2/1999   Goossen
(Continued)

FOREIGN PATENT DOCUMENTS

CN        1776476 A      5/2006
CN      101285771 A     10/2008
(Continued)

OTHER PUBLICATIONS

International Preliminary Report on Patentability dated Jan. 16, 2020 for PCT/JP2018/025642.
(Continued)

*Primary Examiner* — Euncha P Cherry
(74) *Attorney, Agent, or Firm* — Faegre Drinker Biddle & Reath LLP

(57) ABSTRACT

In an optical device, an elastic support unit includes a pair of levers which face in a second direction perpendicular to a first direction, a pair of first torsion support portions which are connected between the levers and the base, a pair of second torsion support portions which are connected between the pair of levers and the movable unit, and a first link member that bridges the levers. The levers and the first link member define a light passage opening. Each of connection positions between the levers and the first torsion support portions is located on a side opposite to the movable unit with respect to the center of the light passage opening in a third direction perpendicular to the first direction and the second direction. A maximum width of the light passage
(Continued)

opening in the second direction is defined by a gap between the levers in the second direction.

8 Claims, 13 Drawing Sheets

(51) Int. Cl.
| | |
|---|---|
| *B81B 3/00* | (2006.01) |
| *G01J 3/02* | (2006.01) |
| *G01J 3/10* | (2006.01) |
| *G01J 3/45* | (2006.01) |
| *G01B 9/02* | (2006.01) |
| *G02B 7/182* | (2021.01) |
| *G02B 27/14* | (2006.01) |
| *G01J 3/453* | (2006.01) |

(52) U.S. Cl.
CPC ..... *G01B 9/02049* (2013.01); *G01B 9/02051* (2013.01); *G01J 3/021* (2013.01); *G01J 3/0237* (2013.01); *G01J 3/108* (2013.01); *G01J 3/45* (2013.01); *G02B 7/182* (2013.01); *G02B 26/0816* (2013.01); *G02B 27/144* (2013.01); *B81B 2201/042* (2013.01); *B81B 2203/0154* (2013.01); *G01B 2290/25* (2013.01); *G01B 2290/35* (2013.01); *G01J 3/4532* (2013.01); *G01J 3/4535* (2013.01); *G01J 2003/104* (2013.01)

(58) Field of Classification Search
CPC ...... G01J 3/4535; G01J 2003/104; G01J 3/06; B81B 3/00; B81B 3/0021; B81B 3/007; B81B 2203/0154; B81B 2201/042; B81B 2203/053; B81B 2201/033; G01B 9/02051; G01B 9/02049; G01B 2290/25; G01B 2290/35; G02B 27/144; G02B 7/182; G02B 26/0816; G02B 27/146; G02B 26/0841
USPC ...................................... 359/221.2
See application file for complete search history.

(56) References Cited

U.S. PATENT DOCUMENTS

| | | | |
|---|---|---|---|
| 6,535,290 B1 | 3/2003 | Spanner et al. | |
| 2002/0167730 A1 | 11/2002 | Needham et al. | |
| 2005/0099665 A1 | 5/2005 | Lee et al. | |
| 2005/0275847 A1 | 12/2005 | Moshe | |
| 2006/0238768 A1 | 10/2006 | Brorson et al. | |
| 2007/0216907 A1 | 9/2007 | Wang et al. | |
| 2008/0024767 A1 | 1/2008 | Seitz | |
| 2008/0187325 A1 | 8/2008 | McCallion et al. | |
| 2008/0284078 A1 | 11/2008 | Wolter et al. | |
| 2009/0051874 A1 | 2/2009 | Masunishi et al. | |
| 2009/0153844 A1 | 6/2009 | Peter et al. | |
| 2010/0067022 A1 | 3/2010 | Nebosis et al. | |
| 2010/0208347 A1 | 8/2010 | Kouma et al. | |
| 2010/0238456 A1 | 9/2010 | Speake et al. | |
| 2011/0043661 A1 | 2/2011 | Podoleanu | |
| 2011/0090551 A1* | 4/2011 | Pirk | G02B 26/0841 359/221.2 |
| 2012/0249984 A1 | 10/2012 | De Boer et al. | |
| 2013/0148966 A1 | 6/2013 | Kurokawa et al. | |
| 2013/0155413 A1 | 6/2013 | Liesener et al. | |
| 2014/0022546 A1 | 1/2014 | Nagai et al. | |
| 2014/0192365 A1 | 7/2014 | Mortada et al. | |
| 2014/0234179 A1 | 8/2014 | Bita | |
| 2015/0168215 A1 | 6/2015 | Day et al. | |
| 2015/0346479 A1 | 12/2015 | Hirokubo | |
| 2016/0231172 A1 | 8/2016 | Medhat et al. | |
| 2017/0018908 A1 | 1/2017 | Nakanishi | |
| 2017/0363469 A1 | 12/2017 | Sabry et al. | |
| 2019/0033136 A1 | 1/2019 | Warashina et al. | |

FOREIGN PATENT DOCUMENTS

| | | |
|---|---|---|
| CN | 101583857 A | 11/2009 |
| CN | 101655602 A | 2/2010 |
| CN | 101871816 A | 10/2010 |
| CN | 102759402 A | 10/2012 |
| CN | 103076090 A | 5/2013 |
| CN | 103547528 A | 1/2014 |
| CN | 103885177 A | 6/2014 |
| CN | 104034422 A | 9/2014 |
| CN | 205262613 U | 5/2016 |
| CN | 105890758 A | 8/2016 |
| CN | 106500591 A | 3/2017 |
| DE | 102006032267 A1 | 5/2007 |
| EP | 0491435 A2 | 6/1992 |
| EP | 1193523 A2 | 4/2002 |
| EP | 2157467 A2 | 2/2010 |
| GB | 2163548 A | 2/1986 |
| GB | 2344168 A | 5/2000 |
| JP | H03-24440 A | 2/1991 |
| JP | H04-323502 A | 11/1992 |
| JP | H05-172738 A | 7/1993 |
| JP | H07-190712 A | 7/1995 |
| JP | H10-253912 A | 9/1998 |
| JP | H10-281719 A | 10/1998 |
| JP | H11-183116 A | 7/1999 |
| JP | 2001-296483 A | 10/2001 |
| JP | 2004-233412 A | 8/2004 |
| JP | 2005-223111 A | 8/2005 |
| JP | 2005-292033 A | 10/2005 |
| JP | 2006-343481 A | 12/2006 |
| JP | 2007-21044 A | 2/2007 |
| JP | 2008-233405 A | 10/2008 |
| JP | 2009-42456 A | 2/2009 |
| JP | 2010-054944 A | 3/2010 |
| JP | 2010-096997 A | 4/2010 |
| JP | 2010-128116 A | 6/2010 |
| JP | 2010-170029 A | 8/2010 |
| JP | 2010-184334 A | 8/2010 |
| JP | 2012-107962 A | 6/2012 |
| JP | 2012-524295 A | 10/2012 |
| JP | 2012-240129 A | 12/2012 |
| JP | 2012-242450 A | 12/2012 |
| JP | 2015-32739 A | 2/2015 |
| JP | 2015-148781 A | 8/2015 |
| JP | 2015-225153 A | 12/2015 |
| JP | 2016-90250 A | 5/2016 |
| JP | 2016-515946 A | 6/2016 |
| JP | 2017-097304 A | 6/2017 |
| JP | 6461446 B1 | 1/2019 |
| WO | WO 03/085371 A2 | 10/2003 |
| WO | WO-2010/121185 A1 | 10/2010 |
| WO | WO-2010/122879 A1 | 10/2010 |
| WO | WO 2011/037015 A1 | 3/2011 |
| WO | WO-2011/061514 A1 | 5/2011 |
| WO | WO-2012/164810 A1 | 12/2012 |
| WO | WO 2014/117158 A1 | 7/2014 |
| WO | WO 2016/007272 A1 | 1/2016 |
| WO | WO-2016/080317 A1 | 5/2016 |
| WO | WO-2016/166872 A1 | 10/2016 |
| WO | WO 2017/087061 A1 | 5/2017 |
| WO | WO 2017/135357 A1 | 8/2017 |

OTHER PUBLICATIONS

International Preliminary Report on Patentability dated Jan. 16, 2020 for PCT/JP2018/025644.
International Preliminary Report on Patentability dated Jan. 16, 2020 for PCT/JP2018/025641.
International Preliminary Report on Patentability dated Jan. 16, 2020 for PCT/JP2018/025633.
International Preliminary Report on Patentability dated Jan. 16, 2020 for PCT/JP2018/025648.

(56) References Cited

OTHER PUBLICATIONS

International Preliminary Report on Patentability dated Jan. 16, 2020 for PCT/JP2018/025645.
International Preliminary Report on Patentability dated Jan. 16, 2020 for PCT/JP2018/025646.
Lu Anjiang et al., "Fourier transform infrared spectrometer based on electro-thermal MEMS micro-mirror", Infrared and Laser Engineering, vol. 45, No. 5, May 2016.

* cited by examiner

Fig.13
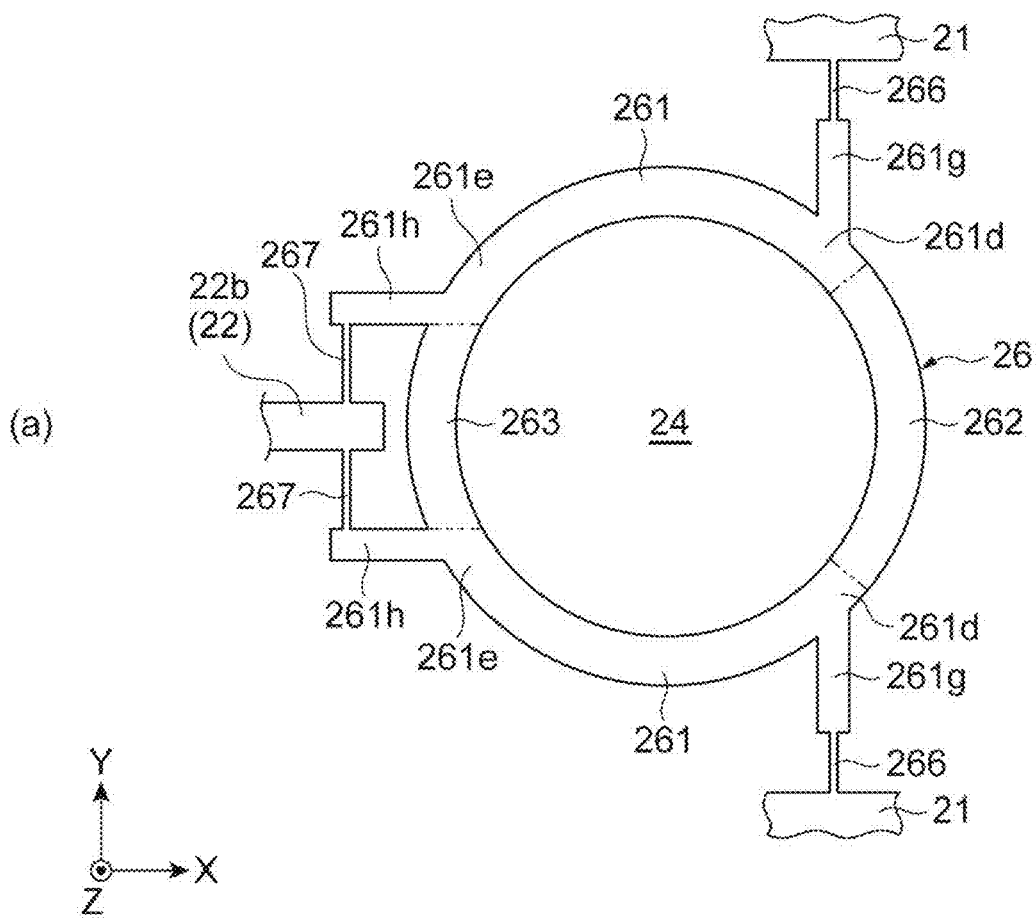
(a)
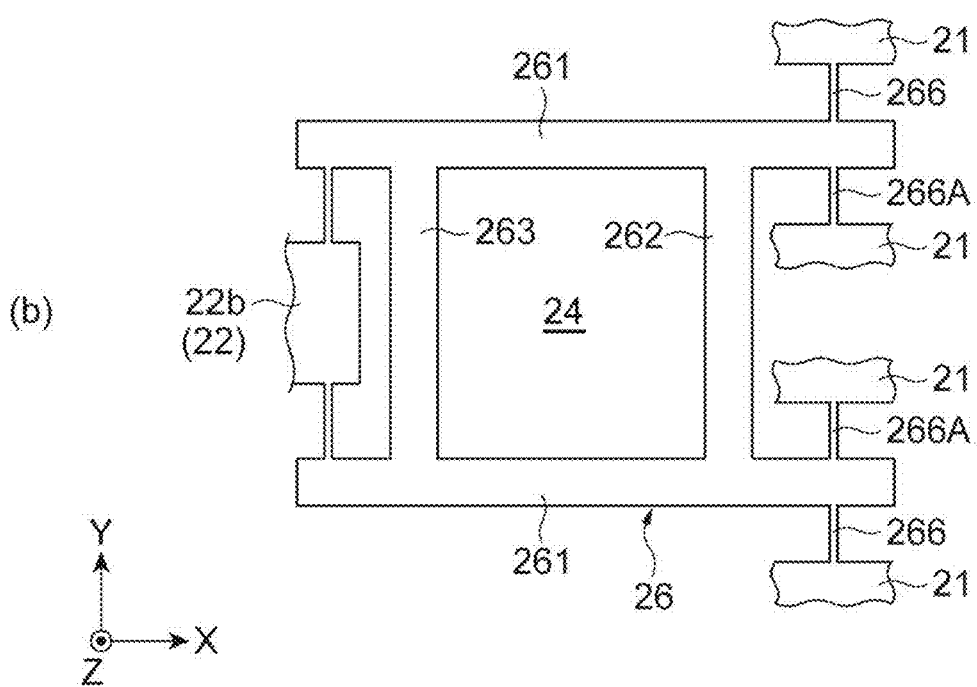
(b)

OPTICAL DEVICE

TECHNICAL FIELD

The present disclosure relates to an optical device.

BACKGROUND ART

An optical device in which an interference optical system is formed on a silicon on insulator (SOI) substrate by a micro electro mechanical system (MEMS) technology is known (for example, refer to Patent Literature 1). In the optical device, it is possible to provide a Fourier transformation type infrared spectral analyzer (FTIR) in which high-accuracy optical arrangement is realized, and thus the optical device has attracted attention.

CITATION LIST

Patent Literature

Patent Literature 1: Japanese Translation of PCT International Application Publication No. 2012-524295

SUMMARY OF INVENTION

Technical Problem

In the above-described optical device, a movable mirror that constitutes the interference optical system moves along a main surface of an SOI substrate. In contrast, it is considered to employ a configuration in which the movable mirror is supported by an elastic support unit so that the movable mirror can move in a direction perpendicular to the main surface of the SOI substrate. In the optical device, it is required to improve external force resistance of the elastic support unit to improve control characteristics of a movable unit. In addition, miniaturization of the entirety of a device and securement of optical performance are also required.

An object of an aspect of the invention is to provide an optical device in which miniaturization of the entirety of a device, an improvement of external force resistance of an elastic support unit, and securement of optical performance are realized.

Solution to Problem

According to an aspect of the present disclosure, there is provided an optical device including: a base that includes a main surface; a movable unit; an optical function unit that is disposed on the movable unit; and an elastic support unit that is connected between the base and the movable unit, and supports the movable unit so that the movable unit is capable of moving along a first direction perpendicular to the main surface. The elastic support unit includes a pair of levers which face each other in a second direction perpendicular to the first direction, a pair of first torsion support portions which extend in the second direction and are respectively connected between the pair of levers and the base, a pair of second torsion support portions which extend in the second direction and are respectively connected between the pair of levers and the movable unit, and a first link member that bridges the pair of levers. The pair of levers and the first link member define a light passage opening, each of connection positions between the pair of levers and the pair of first torsion support portions is located on a side opposite to the movable unit with respect to the center of the light passage opening in a third direction perpendicular to the first direction and the second direction, and a maximum width of the light passage opening in the second direction is defined by a gap between the pair of levers in the second direction.

In the optical device, the first link member bridges the pair of levers, and the light passage opening is defined by the pair of levers and the first link member. Accordingly, an optical path can be set to pass through the light passage opening, and it is possible to miniaturize the entirety of the device, for example, in comparison to a case where the optical path is set to pass through outside of the optical device. In addition, since the first link member bridges the pair of levers, it is possible to improve external force resistance of the elastic support unit. In addition, each of the connection positions between the pair of levers and the pair of first torsion support portions is located on a side opposite to the movable unit with respect to the center of the light passage opening in the third direction, and the maximum width of the light passage opening in the second direction is defined by a gap between the pair of levers in the second direction. Accordingly, it is possible to secure the size of the light passage opening, and thus it is possible to secure optical performance. Accordingly, according to the optical device, it is possible to realize miniaturization of the entirety of the device, improvement of the external force resistance of the elastic support unit, and securement of the optical performance.

The elastic support unit may further include a second link member that bridges the pair of levers, and the light passage opening may be defined by the pair of levers, the first link member, and the second link member. In this case, it is possible to further improve the external force resistance of the elastic support unit.

The elastic support unit may further include a pair of beam members which respectively bridge the pair of levers and the first link member. In this case, it is possible to further improve the external force resistance of the elastic support unit.

The pair of first torsion support portions may be respectively connected to first ends of the pair of levers, and the pair of second torsion support portions are respectively connected to second ends of the pair of lever. In this case, it is possible to secure the size of the light passage opening more preferably.

The maximum width of the light passage opening in the second direction may be greater than a distance between connection positions between the movable unit and the pair of second torsion support portions in the second direction. In this case, it is possible to secure the size of the light passage opening in the second direction more preferably.

The movable unit may include an arrangement portion in which the optical function unit is disposed and a frame portion that surrounds the arrangement portion when viewed from the first direction, and the maximum width of the light passage opening in the second direction may be greater than a distance between connection positions of the frame portion and the pair of second torsion connection portions in the second direction. In this case, it is possible to secure the size of the light passage opening in the second direction more preferably.

In each of the pair of levers, a distance from a connection position with the first link member to a connection position with the pair of second torsion support portions in the third direction may be longer than a distance from a connection position with the first link member to a connection position with the pair of first torsion support portions in the third direction. In this case, it is possible to secure the size of the light passage opening in a direction along the pair of levers more preferably.

The optical function unit may be a mirror surface, and when viewed from the first direction, an area of the light passage opening may be 50% or greater of an area of the mirror surface. In this case, it is possible to secure the size of the light passage opening more preferably.

Advantageous Effects of Invention

According to the invention, it is possible to provide an optical device in which miniaturization of the entirety of a device, an improvement of external force resistance of an elastic support unit, and securement of optical performance are realized.

BRIEF DESCRIPTION OF DRAWINGS

FIG. 13(a) is a schematic plan view of an elastic support unit of a third modification example, and FIG. 13(b) is a schematic plan view of an elastic support unit of a fourth modification example.

DESCRIPTION OF EMBODIMENTS

Figure 1:
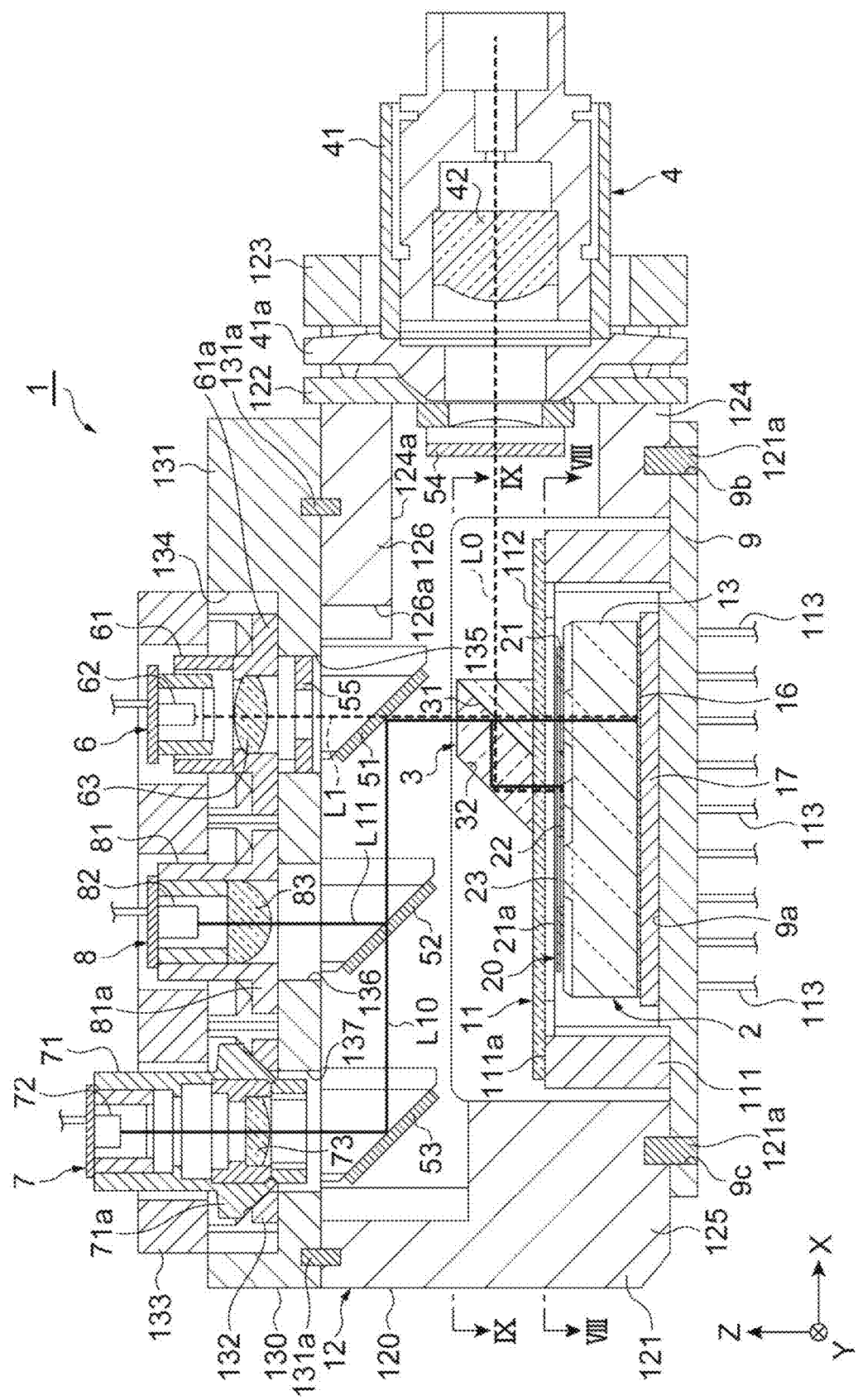
FIG. 1 is a cross-sectional view of an optical module of an embodiment.

Hereinafter, an embodiment of the invention will be described in detail with reference to the accompanying drawings. The same reference numeral will be given to the same or equivalent parts in the respective drawings, and redundant description thereof will be omitted.

[Configuration of Optical Module]

As illustrated in FIG. 1, an optical module 1 includes a mirror unit 2, a beam splitter unit 3, a light incident unit 4, a first light detector 6, a second light source 7, a second light detector 8, a support 9, a first support structure 11, and a second support structure 12. The mirror unit 2 is disposed on one side of the support 9 in a Z-axis direction (first direction), and is attached to the support 9, for example, by an adhesive. For example, the support 9 is formed of copper tungsten, and has a rectangular plate shape. The mirror unit 2 includes a movable mirror 22 that moves in the Z-axis direction, and a fixed mirror 16 of which a position is fixed (details thereof will be described later). For example, the Z-axis direction is a vertical direction, and the one side in the Z-axis direction is an upper side.

The beam splitter unit 3 is disposed on one side of the mirror unit 2 in the Z-axis direction, and is supported by the first support structure 11. The first support structure 11 is attached to the support 9, for example, by an adhesive. The light incident unit 4 is disposed on one side of the beam splitter unit 3 in an X-axis direction (a third direction perpendicular to the first direction), and is supported by the second support structure 12. The first light detector 6, the second light source 7, and the second light detector 8 are disposed on the one side of the beam splitter unit 3 in the Z-axis direction, and are supported by the second support structure 12. The second support structure 12 is attached to the support 9, for example, by a bolt.

In the optical module 1, an interference optical system is constituted by the beam splitter unit 3, the movable mirror 22, and the fixed mirror 16 with respect to each of measurement light L0 and laser light L10. The interference optical system which is constituted with respect to each of the measurement light L0 and the laser light L10 is, for example, a Michelson interference optical system.

With regard to the measurement light L0, interference light L1 of measurement light is detected as follows. That is, when the measurement light L0 that is incident from a first light source (not illustrated) through a measurement target (not illustrated) or the measurement light L0 that is generated from the measurement target (for example, light emitted from the measurement target itself) is incident to the beam splitter unit 3 from the light incident unit 4, the measurement light L0 is divided into a part and the remainder in the beam splitter unit 3. The part of the measurement light L0 is reflected by the movable mirror 22 that reciprocates in the Z-axis direction, and returns to the beam splitter unit 3. On the other hand, the remainder of the measurement light L0 is reflected by the fixed mirror 16 and returns to the beam splitter unit 3. The part and the remainder of the measurement light L0, which returns to the beam splitter unit 3, are emitted from the beam splitter unit 3 as the interference light L1, and the interference light L1 of the measurement light is detected by the first light detector 6.

With regard to the laser light L10, interference light L11 of laser light is detected as follows. That is, when the laser light L10 emitted from the second light source 7 is incident to the beam splitter unit 3, the laser light L10 is divided into a part and the remainder in the beam splitter unit 3. The part of the laser light L10 is reflected by the movable mirror 22 that reciprocates in the Z-axis direction, and returns to the beam splitter unit 3. On the other hand, the remainder of the laser light L10 is reflected by the fixed mirror 16 and returns to the beam splitter unit 3. The part and the remainder of the laser light L10, which return to the beam splitter unit 3, are emitted from the beam splitter unit 3 as the interference light L11, and the interference light L11 of the laser light is detected by the second light detector 8.

According to the optical module 1, measurement of a position of the movable mirror 22 in the Z-axis direction can be measured based on a detection result of the interference light L11 of the laser light, and spectral analysis with respect to the measurement target can be performed based on a measurement result of the position, and a detection result of the interference light L1 of the measurement light.

[Configuration of Mirror Unit]

Figure 2:
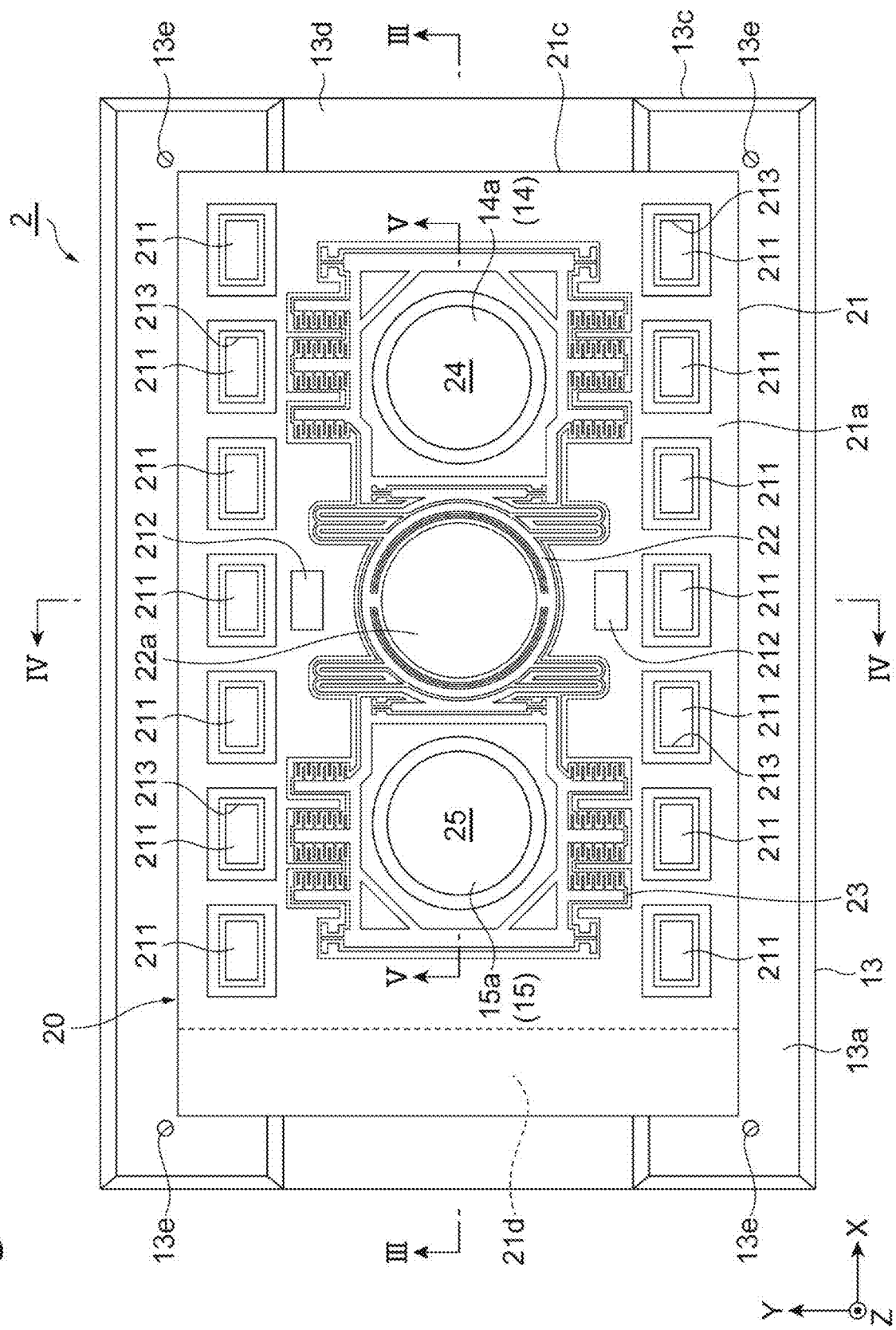
FIG. 2 is a plan view of a mirror unit illustrated in FIG. 1.
Figure 3:
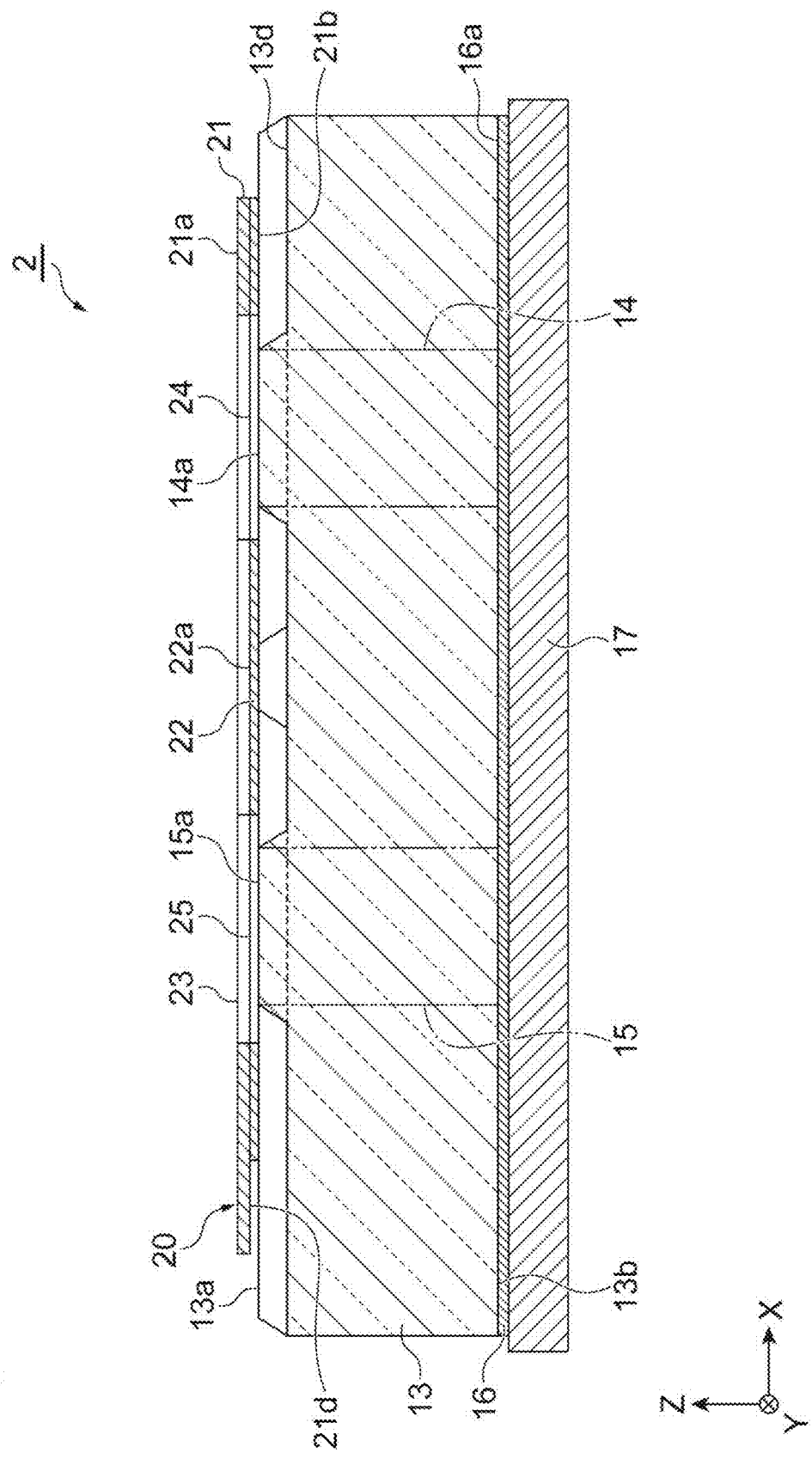
FIG. 3 is a cross-sectional view of the mirror unit which is taken along line illustrated in FIG. 2.
Figure 4:
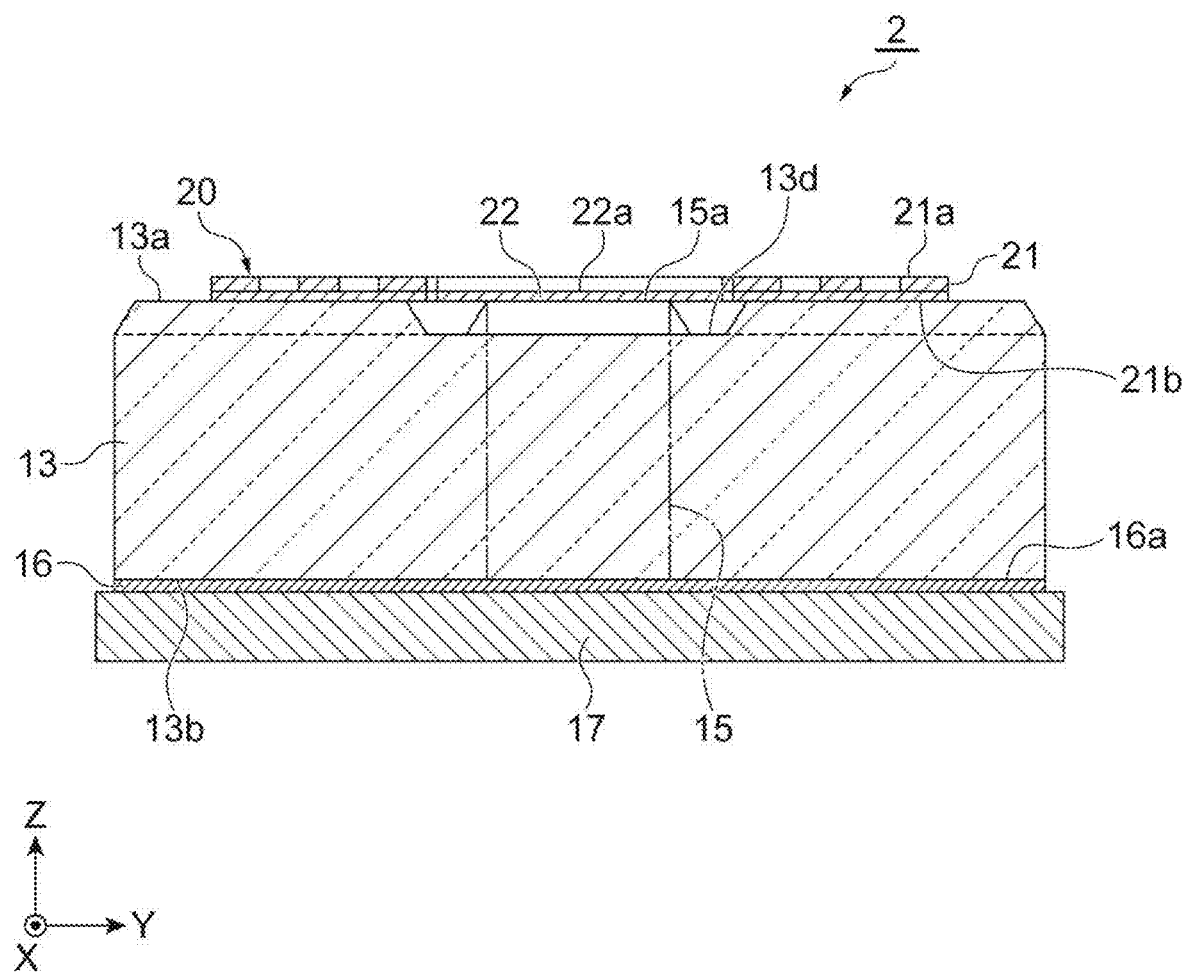
FIG. 4 is a cross-sectional view of the mirror unit which is taken along line IV-IV illustrated in FIG. 2.

As illustrated in FIG. 2, FIG. 3, and FIG. 4, the mirror unit 2 includes a mirror device (optical device) 20, an optical function member 13, the fixed mirror 16, and a stress mitigation substrate 17. The mirror device 20 includes a base 21, the movable mirror 22, and a drive unit 23.

The base 21 includes a first surface 21a (surface on the one side in the Z-axis direction) and a second surface 21b opposite to the first surface 21a. Each of the first surface 21a and the second surface 21b is a main surface of the base 21. For example, the base 21 has a rectangular plate shape, and a size of approximately 10 mm×15 mm×0.35 mm (thickness). The movable mirror 22 includes a mirror surface (optical function unit) 22a, and a movable unit 22b in which the mirror surface 22a is disposed. The movable mirror 22 (movable unit 22b) is supported in the base 21 so that the movable mirror 22 can move in the Z-axis direction perpendicular to the first surface 21a (a first direction perpendicular to a first surface). The drive unit 23 moves the movable mirror 22 in the Z-axis direction.

A pair of light passage openings 24 and 25 are provided in the mirror device 20. The pair of light passage openings 24 and 25 are respectively disposed on both sides of the movable mirror 22 in the X-axis direction. The light passage opening (first light passage portion) 24 constitutes a first portion of an optical path between the beam splitter unit 3 and the fixed mirror 16. In this embodiment, the light passage opening 25 does not function as a light passage opening.

Figure 5:
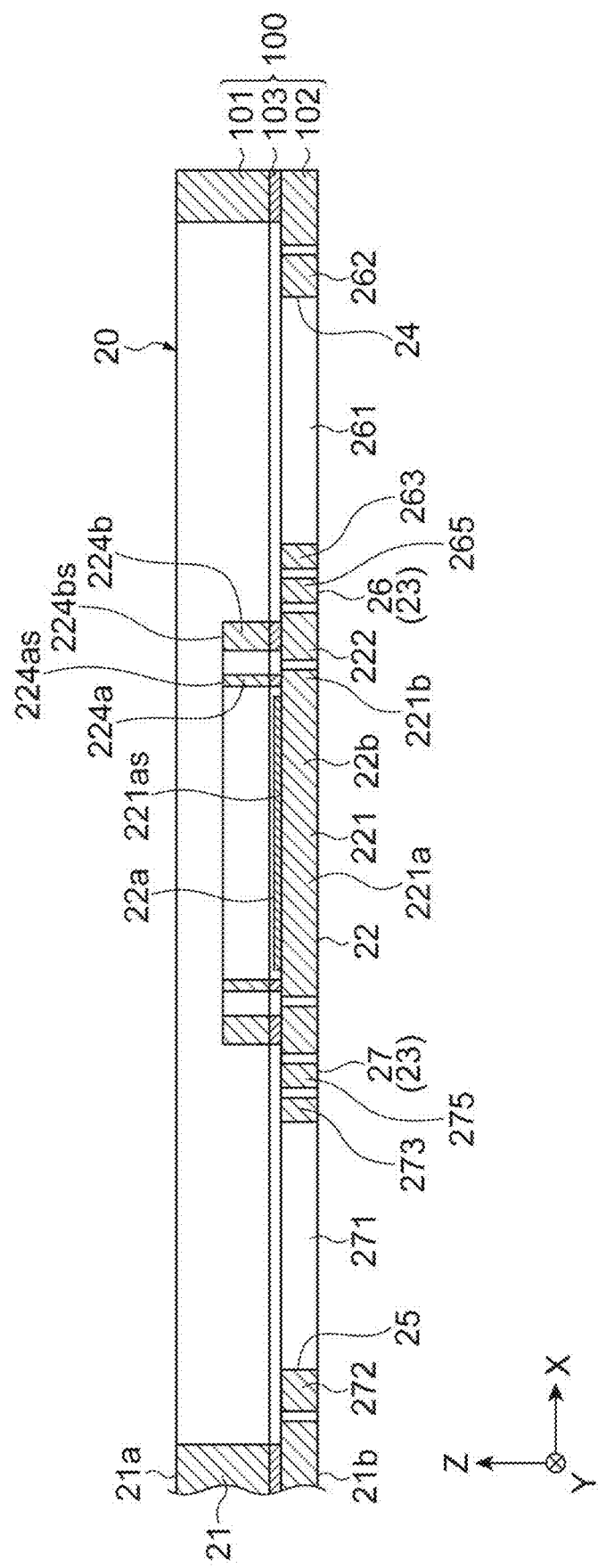
FIG. 5 is a schematic cross-sectional view of a mirror device which is taken along line V-V illustrated in FIG. 2.
Figure 6:
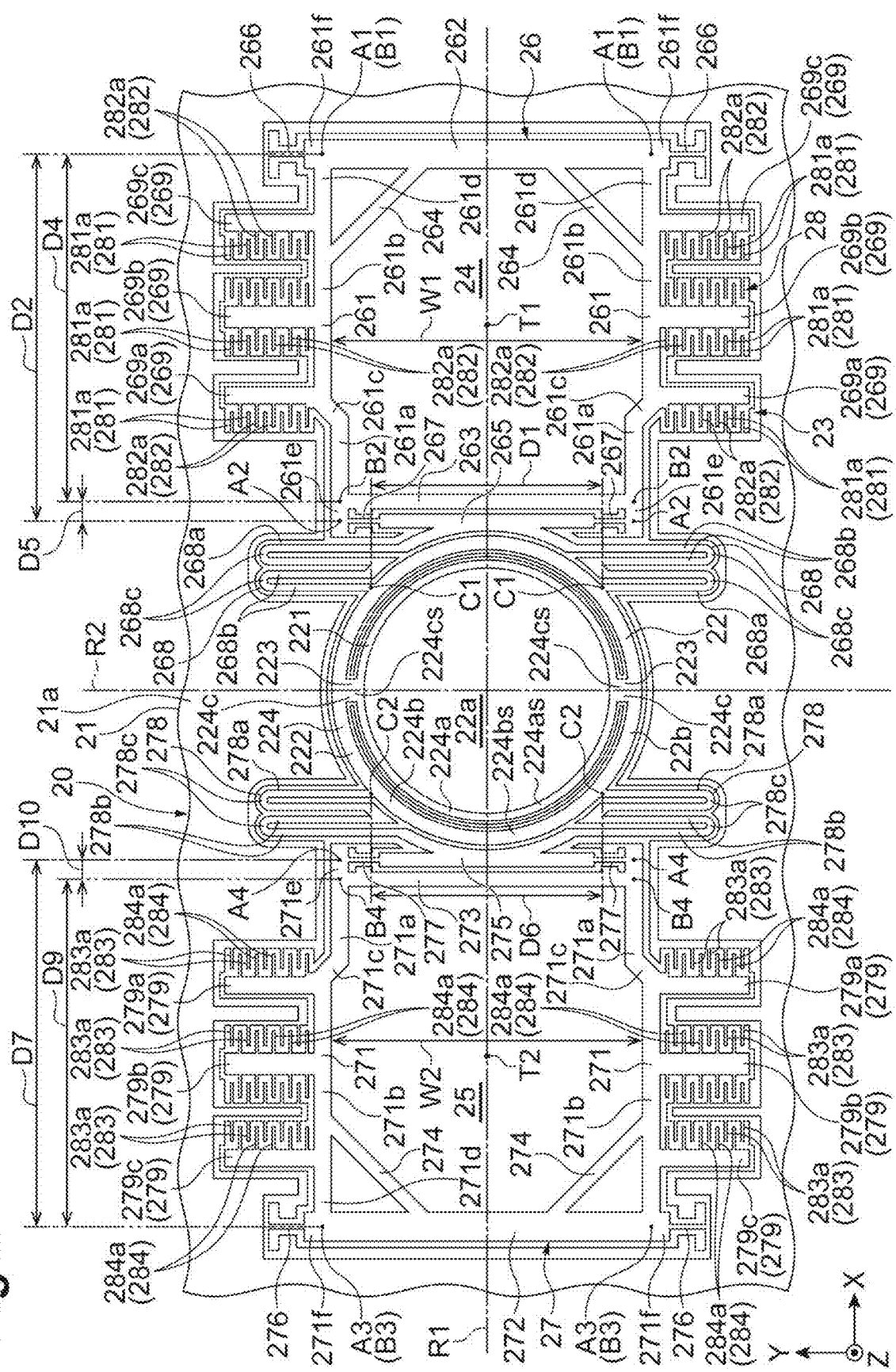
FIG. 6 is a partially enlarged view of the mirror device illustrated in FIG. 2.
Figure 7:
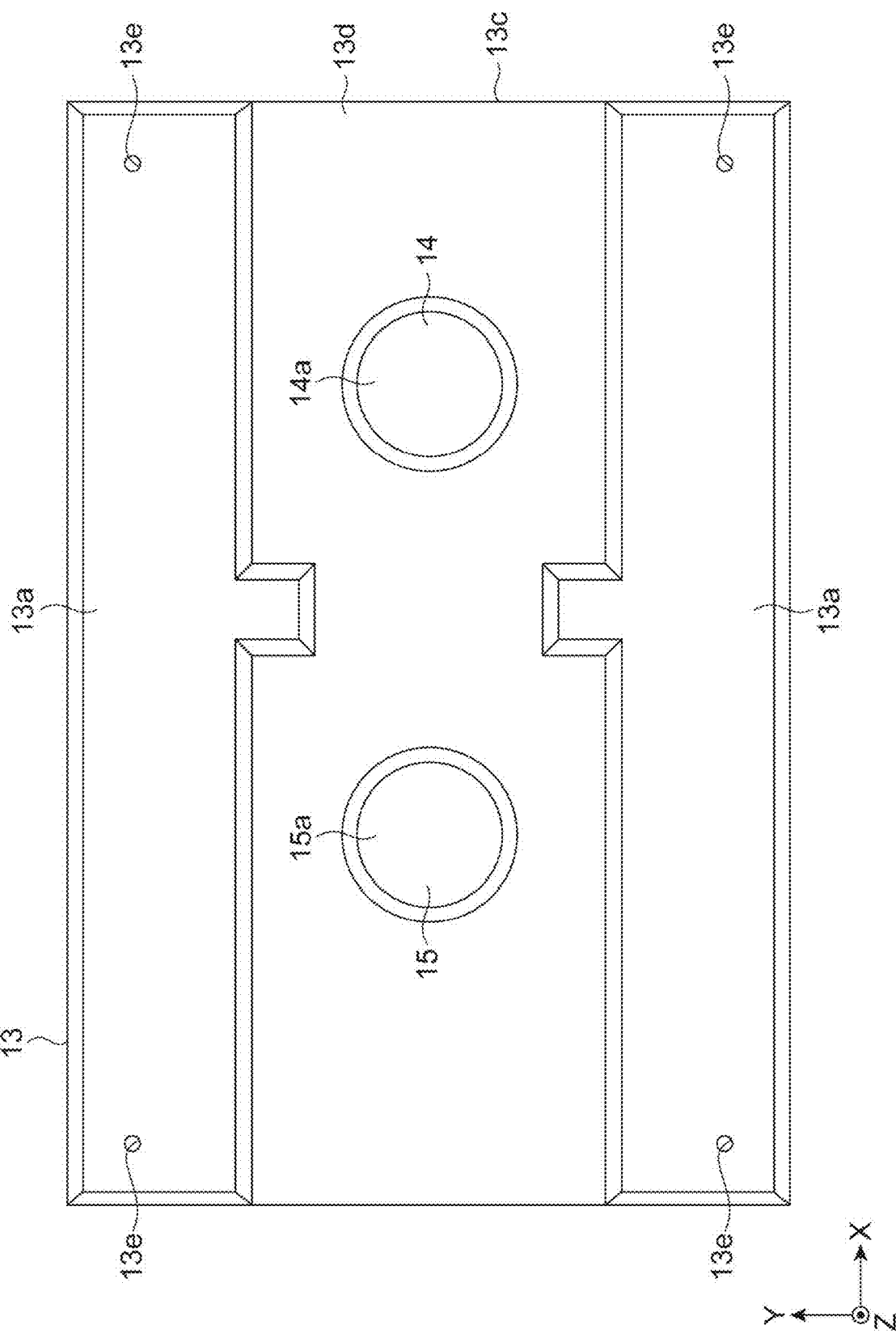
FIG. 7 is a plan view of an optical function member illustrated in FIG. 2.

Here, a configuration of the mirror device 20 will be described in detail with reference to FIG. 2, FIG. 5, and FIG. 6. FIG. 5 is a schematic cross-sectional view of the mirror device 20 illustrated in FIG. 3, and FIG. 5 schematically illustrates the mirror device 20, for example, in a state in which dimensions in the Z-axis direction are enlarged in comparison to actual dimensions.

The base 21, the movable unit 22b of the movable mirror 22, and the drive unit 23 are constituted by a silicon on insulator (SOI) substrate (semiconductor substrate) 100. That is, the mirror device 20 is constituted by the SOI substrate 100. For example, the mirror device 20 is formed in a rectangular plate shape. The SOI substrate 100 includes a support layer 101, a device layer 102, and an intermediate layer 103. The support layer 101 is a first silicon layer (a first semiconductor layer). The device layer 102 is a second silicon layer (a second semiconductor layer). The intermediate layer 103 is an insulating layer that is disposed between the support layer 101 and the device layer 102. The SOT substrate 100 includes the support layer 101, the intermediate layer 103, and the device layer 102 in this order from the one side in the Z-axis direction.

The base 21 is constituted by a part of the support layer 101, the device layer 102, and the intermediate layer 103. The first surface 21a of the base 21 is a surface of the support layer 101 which is opposite to the intermediate layer 103. The second surface 21b of the base 21 is a surface of the device layer 102 which is opposite to the intermediate layer 103. The support layer 101 that constitutes the base 21 is thicker than the device layer 102 that constitutes the base 21. For example, the thickness of the support layer 101 that constitutes the base 21 is approximately four times the thickness of the device layer 102 that constitutes the base 21. As will be described later, in the mirror unit 2, the second surface 21b of the base 21 and a third surface 13a of the optical function member 13 are jointed to each other (refer to FIG. 3 and FIG. 4).

The movable mirror 22 is disposed in a state in which an intersection between an axial line R1 and an axial line R2 is set as the central position (gravity center position). The axial line R1 is a straight line that extends in the X-axis direction. The axial line R2 is a straight line that extends in a Y-axis direction (a second direction that is perpendicular to the first direction and the third direction). When viewed from the Z-axis direction, in the mirror device 20, a portion other than a portion that overlaps a sixth surface 21d of the base 21 to be described later has a shape that is linearly symmetric to each of the axial line R1 and the axial line R2.

The movable mirror 22 (movable unit 22b) includes an arrangement portion 221, a frame portion 222, a pair of connection portions 223, and a beam portion 224. The arrangement portion 221, the frame portion 222, and the pair of connection portions 223 are constituted by a part of the device layer 102. The arrangement portion 221 has a circular shape when viewed from the Z-axis direction. The arrangement portion 221 includes a central portion 221a and an edge portion 221b. For example, the mirror surface 22a is provided on a surface 221as of the central portion 221a on the one side in the Z-axis direction by forming a metal film (metal layer) thereon. The mirror surface 22a extends perpendicular to the Z-axis direction, and has a circular shape. The surface 221as of the central portion 22Ia is a surface on the intermediate layer 103 side in the device layer 102. The mirror surface 22a is located on the other side in the Z-axis direction in comparison to the first surface 21a of the base 21. In other words, the first surface 21a is located on the one side in the Z-axis direction in comparison to the mirror surface 22a. The edge portion 221b surrounds the central portion 221a when viewed from the Z-axis direction.

The frame portion 222 extends in an annular shape to surround the arrangement portion 221 with a predetermined gap from the arrangement portion 221 when viewed from the Z-axis direction. For example, the frame portion 222 has a circular ring shape when viewed from the Z-axis direction. Each of the pair of connection portions 223 connects the arrangement portion 221 and the frame portion 222 to each other. The pair of connection portions 223 are respectively disposed on both sides of the arrangement portion 221 in the Y-axis direction.

The beam portion 224 is constituted by the support layer 101 and the intermediate layer 103 which are disposed on the device layer 102. The beam portion 224 includes an inner beam portion 224a, an outer beam portion 224b, and a pair of connection beam portions 224c. The inner beam portion 224a is disposed on a surface of the edge portion 221b on the one side in the Z-axis direction. The inner beam portion 224a surrounds the mirror surface 22a when viewed from the Z-axis direction. For example, an outer edge of the inner beam portion 224a extends along an outer edge of the arrangement portion 221 with a predetermined gap from the outer edge of the arrangement portion 221 when viewed from the Z-axis direction. An inner edge of the inner beam portion 224a extends along an outer edge of the mirror surface 22a with a predetermined gap from the outer edge of the mirror surface 22a when viewed from the Z-axis direction. An end surface 224as of the inner beam portion 224a on the one side in the Z-axis direction is located on the one side in the Z-axis direction in comparison to the mirror surface 22a.

The outer beam portion 224b is disposed on a surface of the frame portion 222 on the one side in the Z-axis direction. The outer beam portion 224b surrounds the inner beam portion 224a and the mirror surface 22a when viewed from the Z-axis direction. For example, an outer edge of the outer beam portion 224b extends along an outer edge of the frame portion 222 with a predetermined gap from the outer edge of the frame portion 222 when viewed from the Z-axis direction. An inner edge of the outer beam portion 224b extends along an inner edge of the frame portion 222 with a predetermined gap from the inner edge of the frame portion 222 when viewed from the Z-axis direction. An end surface 224*bs* of the outer beam portion 224*b* on the one side in the Z-axis direction is located on the one side in the Z-axis direction in comparison to the mirror surface 22*a*.

The pair of connection beam portions 224*c* are respectively disposed on surfaces of the pair of connection portions 223 on the one side in the Z-axis direction. The connection beam portions 224*c* connect the inner beam portion 224*a* and the outer beam portion 224*b* to each other. End surfaces 224*cs* of the connection beam portions 224*c* on the one side in the Z-axis direction are located on the one side in the Z-axis direction in comparison to the mirror surface 22*a*.

The thickness of the inner beam portion 224*a*, the thickness of the outer beam portion 224*b*, and the thickness of the respective connection beam portions 224*c* in the Z-axis direction are the same as each other. That is, the thickness of the support layer 101 that constitutes the inner beam portion 224*a*, the outer beam portion 224*b*, and the respective connection beam portions 224*c* is the same in each case. The end surface 224*as* of the inner beam portion 224*a*, the end surface 224*bs* of the outer beam portion 224*b*, and the end surfaces 224*cs* of the respective connection beam portions 224*c* are located on the same plane perpendicular to the Z-axis direction. The support layer 101 that constitutes the inner beam portion 224*a*, the outer beam portion 224*b*, and the respective connection beam portions 224*c* is thinner than the support layer 101 that constitutes the base 21. Accordingly, the end surfaces 224*as*, 224*bs*, and 224*cs* are located on the one side in the Z-axis direction in comparison to the first surface 21*a* of the base 21. In other words, the first surface 21*a* is located on the other side in the Z-axis direction in comparison to the end surfaces 224*as*, 224*bs*, and 224*cs*.

When viewed from the Z-axis direction, a width of the outer beam portion 224*b* is wider than a width of the inner beam portion 224*a*. The width of the inner beam portion 224*a* when viewed from the Z-axis direction is a length of the inner beam portion 224*a* in a direction perpendicular to the extending direction of the inner beam portion 224*a*, and is a length of the inner beam portion 224*a* in a radial direction of the inner beam portion 224*a* in this embodiment. This is also true of a width of the outer beam portion 224*b* when viewed from the Z-axis direction. A width of each of the connection beam portions 224*c* is wider than the width of each of the inner beam portion 224*a* and the outer beam portion 224*b*. The width of each of the connection beam portion 224*c* is a length of each of the connection beam portion 224*c* along the extending direction of the inner beam portion 224*a*.

The drive unit 23 includes a first elastic support unit 26, a second elastic support unit 27, and an actuator unit 28. The first elastic support unit 26, the second elastic support unit 27, and the actuator unit 28 are constituted by a part of the device layer 102.

Each of the first elastic support unit 26 and the second elastic support unit 27 is connected between the base 21 and the movable mirror 22. The first elastic support unit 26 and the second elastic support unit 27 support the movable mirror 22 so that the movable mirror 22 (movable unit 22*b*) can move in the Z-axis direction.

The first elastic support unit 26 includes a pair of levers 261, a first link member 262, a second link member 263, a pair of beam members 264, an intermediate member 265, a pair of first torsion bars (first torsion support portions) 266, a pair of second torsion bars (second torsion support portions) 267, a pair of non-linearity mitigation springs 268, and a plurality of electrode support portions 269.

The pair of levers 261 are respectively disposed on both sides of the light passage opening 24 in the Y-axis direction, and face each other in the Y-axis direction. Each of the levers 261 has a plate shape that extends along a plane perpendicular to the Z-axis direction. The lever 261 includes a first portion 261*a*, a second portion 261*b* that is disposed on a side opposite to the movable mirror 22 with respect to the first portion 261*a*, and a third portion 261*c* that is connected to the first portion 261*a* and the second portion 261*b*. The first portion 261*a* and the second portion 261*b* extend in the X-axis direction. A length of the first portion 261*a* in the X-axis direction is shorter than a length of the second portion 261*b* in the X-axis direction. The third portions 261*c* of the pair of levers 261 obliquely extend to be spaced away from each other as going away from the movable mirror 22.

The first link member 262 bridges first ends 261*d* of the pair of levers 261 on a side opposite to the movable mirror 22. The first link member 262 has a plate shape that extends along a plane perpendicular to the Z-axis direction, and extends in the Y-axis direction. The second link member 263 bridges second ends 261*e* of the pair of levers 261 on the movable mirror 22 side. The second link member 263 has a plate shape that extends along a plane perpendicular to the Z-axis direction, and extends in the Y-axis direction. A width of the second link member 263 in the X-axis direction is narrower than a width of the first link member 262 in the X-axis direction. A length of the second link member 263 in the Y-axis direction is shorter than a length of the first link member 262 in the Y-axis direction.

The pair of beam members 264 respectively bridge the second portions 261*b* of the pair of levers 261 and the first link member 262. The respective beam members 264 have a plate shape that extends along a plane perpendicular to the Z-axis direction. The pair of beam members 264 obliquely extend to approach each other as going away from the movable mirror 22. The pair of levers 261, the first link member 262, the second link member 263, and the pair of beam members 264 define the light passage opening 24. The light passage opening 24 has a polygonal shape when viewed from the Z-axis direction. For example, the light passage opening 24 is a cavity (hole). Alternatively, a material having optical transparency with respect to the measurement light L0 and the laser light L10 may be disposed in the light passage opening 24.

The intermediate member 265 has a plate shape that extends along a plane perpendicular to the Z-axis direction, and extends in the Y-axis direction. The intermediate member 265 is disposed between the movable mirror 22 and the second link member 263 (in other words, between the movable mirror 22 and the light passage opening 24). The intermediate member 265 is connected to the movable mirror 22 through the non-linearity mitigation springs 268 as to be described later.

The pair of first torsion bars 266 respectively bridge the first end 261*d* of one lever 261 and the base 21, and the first end 261*d* of the other lever 261 and the base 21. That is, the pair of first torsion bars 266 are respectively connected between the pair of levers 261 and the base 21. The first torsion bars 266 extend in the Y-axis direction. The pair of first torsion bars 266 are disposed on the same central line parallel to the Y-axis direction. In this embodiment, the central line of the first torsion bars 266 and the central line of the first link member 262 are located on the same straight line. A protrusion 261*f* that protrudes outward in the Y-axis direction is provided in each of the first ends 261*d* of the levers 261, and each of the first torsion bars 266 is connected to the protrusion 261*f*.

The pair of second torsion bars 267 respectively bridge the second end 261*e* of one lever 261 and one end of the intermediate member 265, and the second end 261*e* of the other lever 261 and the other end of the intermediate member 265. That is, the pair of second torsion bars 267 are respectively connected between the pair of levers 261 and the movable mirror 22. The respective second torsion bars 267 extend in the Y-axis direction. The pair of second torsion bars 267 are disposed on the same central line parallel to the Y-axis direction.

The pair of non-linearity mitigation springs 268 are connected between the movable mirror 22 and the intermediate member 265. That is, the pair of non-linearity mitigation springs 268 are connected between the movable mirror 22 and the second torsion bar 267. Each of the non-linearity mitigation springs 268 includes a meandering portion 268*a* that extends in a meandering manner when viewed from the Z-axis direction. The meandering portion 268*a* includes a plurality of straight portions 268*b* which extend in the Y-axis direction and are aligned in the X-axis direction, and a plurality of folded portions 268*c* which alternately connect both ends of the plurality of straight portions 268*b*. One end of the meandering portion 268*a* is connected to the intermediate member 265, and the other end of the meandering portion 268*a* is connected to the frame portion 222. In the meandering portion 268*a*, a portion on the frame portion 222 side has a shape along the outer edge of the frame portion 222.

The non-linearity mitigation spring 268 is constituted as follows. In a state in which the movable mirror 22 has moved in the Z-axis direction, the amount of defamation of the non-linearity mitigation spring 268 around the Y-axis direction becomes smaller than the amount of deformation of each of the first torsion bar 266 and the second torsion bar 267 around the Y-axis direction, and the amount of deformation of the non-linearity mitigation spring 268 in the X-axis direction becomes larger than the amount of deformation of each of the first torsion bar 266 and the second torsion bar 267 in the X-axis direction. Accordingly, it is possible to suppress occurrence of non-linearity in twist deformation of the first torsion bar 266 and the second torsion bar 267, and it is possible to suppress deterioration of control characteristics of the movable mirror 22 due to the non-linearity. The amount of deformation of the first torsion bar 266, the second torsion bar 267, and the non-linearity mitigation spring 268 around the Y-axis direction represents, for example, an absolute value of a twist amount (twist angle). The amount of deformation of the first torsion bar 266, the second torsion bar 267, and the non-linearity mitigation spring 268 in the X-axis direction represents, for example, an absolute value of a deflection amount. The amount of deformation of a member around the Y-axis direction represents the amount of deformation of the member in a peripheral direction of a circle of which the center is set to an axial line that passes through the center of the member and is parallel to the Y-axis. This is also true of first torsion bars 276, second torsion bars 277, and a non-linearity mitigation spring 278 to be described later.

The plurality of electrode support portions 269 include a pair of first electrode support portions 269*a*, a pair of second electrode support portions 269*b*, and a pair of third electrode support portions 269*c*. Each of the electrode support portions 269*a*, 269*b*, and 269*c* has a plate shape that extends along a plane perpendicular to the Z-axis direction, and extends in the Y-axis direction. Each of the electrode support portions 269*a*, 269*b*, and 269*c* extends from the second portion 261*b* of the lever 261 toward a side opposite to the light passage opening 24. The pair of first electrode support portions 269*a* are disposed on the same central line parallel to the Y-axis direction. The pair of second electrode support portions 269*b* are disposed on the same central line parallel to the Y-axis direction. The pair of third electrode support portions 269*c* are disposed on the same central line parallel to the Y-axis direction. In the X-axis direction, the first electrode support portions 269*a*, the second electrode support portions 269*b*, and the third electrode support portions 269*c* are aligned in this order from the movable mirror 22 side.

The second elastic support unit 27 includes a pair of levers 271, a first link member 272, a second link member 273, a pair of beam members 274, an intermediate member 275, a pair of first torsion bars (first torsion support portions) 276, a pair of second torsion bars (second torsion support portions) 277, a pair of non-linearity mitigation springs 278, and a plurality of electrode support portions 279.

The pair of levers 271 are respectively disposed on both sides of the light passage opening 25 in the Y-axis direction, and face each other in the Y-axis direction. Each of the levers 271 has a plate shape that extends along a plane perpendicular to the Z-axis direction. The lever 271 includes a first portion 271*a*, a second portion 271*b* that is disposed on a side opposite to the movable mirror 22 with respect to the first portion 271*a*, and a third portion 271*c* that is connected to the first portion 271*a* and the second portion 271*b*. The first portion 271*a* and the second portion 271*b* extend in the X-axis direction. A length of the first portion 271*a* in the X-axis direction is shorter than a length of the second portion 271*b* in the X-axis direction. The third portions 271*c* of the pair of levers 271 obliquely extend to be spaced away from each other as going away from the movable mirror 22.

The first link member 272 bridges first ends 271*d* of the pair of levers 271 on a side opposite to the movable mirror 22. The first link member 272 has a plate shape that extends along a plane perpendicular to the Z-axis direction, and extends in the Y-axis direction. The second link member 273 bridges second ends 271*e* of the pair of levers 271 on the movable mirror 22 side. The second link member 273 has a plate shape that extends along a plane perpendicular to the Z-axis direction, and extends in the Y-axis direction. A width of the second link member 273 in the X-axis direction is narrower than a width of the first link member 272 in the X-axis direction. A length of the second link member 273 in the Y-axis direction is shorter than a length of the first link member 272 in the Y-axis direction.

The pair of beam members 274 respectively bridge the second portions 271*b* of the pair of levers 271 and the first link member 272. The respective beam members 274 have a plate shape that extends along a plane perpendicular to the Z-axis direction. The pair of beam members 274 obliquely extend to approach each other as going away from the movable mirror 22. The pair of levers 271, the first link member 272, the second link member 273, and the pair of beam members 274 define the light passage opening 25. The light passage opening 25 has a polygonal shape when viewed from the Z-axis direction. For example, the light passage opening 25 is a cavity (hole). Alternatively, a material having optical transparency with respect to the measurement light L0 and the laser light L10 may be disposed in the light passage opening 25.

The intermediate member 275 has a plate shape that extends along a plane perpendicular to the Z-axis direction, and extends in the Y-axis direction. The intermediate member 275 is disposed between the movable mirror 22 and the second link member 273 (in other words, between the movable mirror 22 and the light passage opening 25). The intermediate member 275 is connected to the movable mirror 22 through the non-linearity mitigation springs 278 as to be described later.

The pair of first torsion bars 276 respectively bridge the first end 271d of one lever 271 and the base 21, and the first end 271d of the other lever 271 and the base 21. That is, the pair of first torsion bars 276 are respectively connected between the pair of levers 271 and the base 21. The first torsion bars 276 extend in the Y-axis direction. The pair of first torsion bars 276 are disposed on the same central line parallel to the Y-axis direction. In this embodiment, the central line of the first torsion bars 276 and the central line of the first link member 272 are located on the same straight line. A protrusion 271f that protrudes outward in the Y-axis direction is provided in each of the first ends 271d of the levers 271, and each of the first torsion bars 276 is connected to the protrusion 271f.

The pair of second torsion bars 277 respectively bridge the second end 271e of one lever 271 and one end of the intermediate member 275, and the second end 271e of the other lever 271 and the other end of the intermediate member 275. That is, the pair of second torsion bars 277 are respectively connected between the pair of levers 271 and the movable mirror 22. The respective second torsion bars 277 extend in the Y-axis direction. The pair of second torsion bars 277 are disposed on the same central line parallel to the Y-axis direction.

The pair of non-linearity mitigation springs 278 are connected between the movable mirror 22 and the intermediate member 275. That is, the pair of non-linearity mitigation springs 278 are connected between the movable mirror 22 and the second torsion bar 277. Each of the non-linearity mitigation springs 278 includes a meandering portion 278a that extends in a meandering manner when viewed from the Z-axis direction. The meandering portion 278a includes a plurality of straight portions 278b which extend in the Y-axis direction and are aligned in the X-axis direction, and a plurality of folded portions 278c which alternately connect both ends of the plurality of straight portions 278b. One end of the meandering portion 278a is connected to the intermediate member 275, and the other end of the meandering portion 278a is connected to the frame portion 222. In the meandering portion 278a, a portion on the frame portion 222 side has a shape along the outer edge of the frame portion 222.

The non-linearity mitigation spring 278 is constituted as follows. In a state in which the movable mirror 22 has moved in the Z-axis direction, the amount of deformation of the non-linearity mitigation spring 278 around the Y-axis direction becomes smaller than the amount of deformation of each of the first torsion bar 276 and the second torsion bar 277 around the Y-axis direction, and the amount of deformation of the non-linearity mitigation spring 278 in the X-axis direction becomes larger than the amount of deformation of each of the first torsion bar 276 and the second torsion bar 277 in the X-axis direction. Accordingly, it is possible to suppress occurrence of non-linearity in twist deformation of the first torsion bar 276 and the second torsion bar 277, and it is possible to suppress deterioration of control characteristics of the movable mirror 22 due to the non-linearity.

The plurality of electrode support portions 279 includes a pair of first electrode support portions 279a, a pair of second electrode support portions 279b, and a pair of third electrode support portions 279c. Each of the electrode support portions 279a, 279b, and 279c has a plate shape that extends along a plane perpendicular to the Z-axis direction, and extends in the Y-axis direction. Each of the electrode support portions 279a, 279b, and 279c extends from the second portion 271b of the lever 271 toward a side opposite to the light passage opening 25. The pair of first electrode support portions 279a are disposed on the same central line parallel to the Y-axis direction. The pair of second electrode support portions 279b are disposed on the same central line parallel to the Y-axis direction. The pair of third electrode support portions 279c are disposed on the same central line parallel to the Y-axis direction. In the X-axis direction, the first electrode support portions 279a, the second electrode support portions 279b, and the third electrode support portions 279c are aligned in this order from the movable mirror 22 side.

The actuator unit 28 moves the movable mirror 22 in the Z-axis direction. The actuator unit 28 includes a fixed comb-tooth electrode 281, a movable comb-tooth electrode 282, a fixed comb-tooth electrode 283, and a movable comb-tooth electrode 284. Positions of the fixed comb-tooth electrodes 281 and 283 are fixed. The movable comb-tooth electrodes 282 and 284 move in accordance with movement of the movable mirror 22.

The fixed comb-tooth electrode 281 is provided on a part of a surface, which faces the electrode support portions 269, of the device layer 102 of the base 21. The fixed comb-tooth electrode 281 includes a plurality of fixed comb-teeth 281a which extend along a plane perpendicular to the Y-axis direction. The fixed comb-teeth 281a are aligned in the Y-axis direction with a predetermined gap therebetween.

The movable comb-tooth electrode 282 is provided on a surface of each of the first electrode support portions 269a on the movable mirror 22 side, on surfaces of each of the second electrode support portions 269b on both sides in the X-axis direction, and on a surface of each of the third electrode support portion 269c on the movable mirror 22 side. The movable comb-tooth electrode 282 includes a plurality of movable comb-teeth 282a which extend along a plane perpendicular to the Y-axis direction. The movable comb-teeth 282a are aligned in the Y-axis direction with a predetermined gap therebetween.

In the fixed comb-tooth electrode 281 and the movable comb-tooth electrode 282, the plurality of fixed comb-teeth 281a and the plurality of movable comb-teeth 282a are alternately arranged. That is, each of the fixed comb-teeth 281a of the fixed comb-tooth electrode 281 is located between the movable comb-teeth 282a of the movable comb-tooth electrode 282. The fixed comb-teeth 281a and the movable comb-teeth 282a, which are adjacent to each other, face each other in the Y-axis direction. A distance between the fixed comb-tooth 281a and the movable comb-tooth 282a, which are adjacent to each other, is approximately several μm.

The fixed comb-tooth electrode 283 is provided on a part of a surface, which faces the electrode support portions 279, of the device layer 102 of the base 21. The fixed comb-tooth electrode 283 includes a plurality of fixed comb-teeth 283a which extend along a plane perpendicular to the Y-axis direction. The fixed comb-teeth 283 a are aligned in the Y-axis direction with a predetermined gap therebetween.

The movable comb-tooth electrode 284 is provided on a surface of each of the first electrode support portion 279a on the movable mirror 22 side, on surfaces of each of the second electrode support portions 279b on both sides in the X-axis direction, and on a surface of each of the third electrode support portion 279c on the movable mirror 22 side. The movable comb-tooth electrode 284 includes a plurality of movable comb-teeth 284a which extend along a plane perpendicular to the Y-axis direction. The movable comb-teeth 284a are aligned in the Y-axis direction with a predetermined gap therebetween.

In the fixed comb-tooth electrode 283 and the movable comb-tooth electrode 284, the plurality of fixed comb-teeth 283a and the plurality of movable comb-teeth 284a are alternately arranged. That is, each of the fixed comb-teeth 283a of the fixed comb-tooth electrode 283 is located between the movable comb-teeth 284a of the movable comb-tooth electrode 284. The fixed comb-teeth 283a and the movable comb-teeth 284a, which are adjacent to each other, face each other in the Y-axis direction. For example, a distance between the fixed comb-tooth 283a and the movable comb-tooth 284a, which are adjacent to each other, is approximately several μm.

A plurality of electrode pads 211 are provided in the base 21. The electrode pads 211 are disposed on a surface of the device layer 102 in an opening 213 formed in the first surface 21a of the base 21 to reach the device layer 102. Some of the plurality of electrode pads 211 are electrically connected to the fixed comb-tooth electrode 281 or the fixed comb-tooth electrode 283 via the device layer 102. Several other electrode pads 211 among the plurality of electrode pads 211 are electrically connected to the movable comb-tooth electrode 282 or the movable comb-tooth electrode 284 via the first elastic support unit 26 or the second elastic support unit 27. In addition, a pair of electrode pads 212 which can be used as ground electrodes are provided in the base 21. The pair of electrode pads 212 are disposed on the first surface 21a to be located on both sides of the movable mirror 22 in the Y-axis direction.

In the mirror device 20 configured as described above, an electric signal for moving the movable mirror 22 in the Z-axis direction, is input to the drive unit 23 through a lead pin 113 to be described later and a wire (not illustrated). Accordingly, for example, an electrostatic force is generated between the fixed comb-tooth electrode 281 and the movable comb-tooth electrode 282 which face each other, and the fixed comb-tooth electrode 283 and the movable comb-tooth electrode 284 which face each other so that the movable mirror 22 moves to one side in the Z-axis direction. At this time, the first torsion bars 266 and 276 and the second torsion bars 267 and 277 in the first elastic support unit 26 and the second elastic support unit 27 are twisted, and an elastic force is generated in the first elastic support unit 26 and the second elastic support unit 27. In the mirror device 20, when a periodic electric signal is applied to the drive unit 23, it is possible to reciprocate the movable mirror 22 in the Z-axis direction at a resonance frequency level. In this manner, the drive unit 23 functions as an electrostatic actuator.

[Configuration of Elastic Support Unit]

The configuration of the first elastic support unit 26 and the second elastic support unit 27 will be further described with reference to FIG. 6. Hereinafter, a position at which the lever 261 and the first torsion bar 266 are connected is set as a connection position A1, and a position at which the lever 261 and the second torsion bar 267 are connected is set as a connection position A2. A position at which the lever 261 and the first link member 262 are connected is set as a connection position B1, and a position at which the lever 261 and the second link member 263 are connected is set as a connection position B2. A position at which the frame portion 222 and the second torsion bar 267 are connected is set as a connection position C1.

For example, the connection position A1 corresponds to the central portion of a connection portion between the lever 261 and the first torsion bar 266, and is a position of an intersection between the central line of the second portion 261b of the lever 261 and the central line of the first torsion bar 266 in this embodiment. For example, the connection position A2 corresponds to the central portion of a connection portion between the lever 261 and the second torsion bar 267, and is a position of an intersection between the central line of the first portion 261a of the lever 261 and the central line of the second torsion bar 267 in this embodiment. For example, the connection position B1 corresponds to the central portion of a connection portion between the lever 261 and the first link member 262, and is a position of an intersection between the central line of the second portion 261b of the lever 261 and the central line of the first link member 262 in this embodiment. In this embodiment, the connection position B1 matches the connection position A1. For example, the connection position B2 corresponds to the central portion of a connection portion between the lever 261 and the second link member 263, and is a position of an intersection between the central line of the first portion 261a of the lever 261 and the central line of the second link member 263.

For example, the connection position C1 corresponds to the central portion of a connection portion at which the frame portion 222 and the second torsion bar 267 are connected. In a case where the frame portion 222 and the second torsion bar 267 are connected to each other via another element (in this embodiment, the intermediate member 265 and the non-linearity mitigation spring 268) similar to this embodiment, the connection position C1 is a position at which the frame portion 222 and the other element are connected to each other. In this embodiment, the connection position C1 is a position of an intersection between an outer edge (line segment that virtually extends from the outer edge) of the frame portion 222 and the central line of each of the straight portions 268b which are continuous with the frame portion 222. In other words, the connection position C1 is a connection position between the movable unit 22b and the second torsion bar 267.

In the mirror device 20, each of the connection position A1 and the connection position B1 is located on a side opposite to the movable mirror 22 with respect to the center T1 of the light passage opening 24 in the X-axis direction. Each of the connection position A2 and the connection position B2 is located on the movable mirror 22 side with respect to the center T1 of the light passage opening 24 in the X-axis direction.

A maximum width W1 of the light passage opening 24 in the Y-axis direction is defined by a gap between the pair of levers 261 in the Y-axis direction. In this embodiment, the maximum width W1 is a gap between the second portions 261b of the pair of levers 261, and is the same as a length of the first link member 262. The maximum width W1 is greater than a distance D1 between the connection positions C1 in the Y-axis direction.

In the respective levers 261, a distance D2 from the connection position B1 to the connection position A2 in the X-axis direction is longer than a distance D3 from the connection position B1 to the connection position A1 in the X-axis direction. In this embodiment, the connection position A1 and the connection position B1 match each other, and thus the distance D3 is a value of zero. In other words, the first link member 262 is connected to the respective levers 261 at a position closer to the first torsion bar 266 in comparison to the second torsion bar 267.

In the respective levers 261, a distance D4 from the connection position B2 to the connection position A1 in the X-axis direction is longer than a distance D5 from the connection position B2 to the connection position A2 in the X-axis direction. In other words, the second link member 263 is connected to the respective levers 261 at a position closer to the second torsion bar 267 in relation to the first torsion bar 266.

When viewed from the Z-axis direction, an area of the light passage opening 24 is 50% or greater of an area of the mirror surface 22a. More preferably, the area of the light passage opening 24 is 70% or greater than the area of the mirror surface 22a. In this embodiment, when viewed from the Z-axis direction, the area of the light passage opening 24 is greater than the area of the mirror surface 22a. A shape of the light passage opening 24 is linearly symmetric to a straight line (in this embodiment, the axial line R1) that passes through the center of the mirror surface 22a and the center T1 of the light passage opening 24. The first torsion bars 266 and the second torsion bars 267 do not define the light passage opening 24. That is, the first torsion bars 266 and the second torsion bars 267 are disposed outside of the light passage opening 24. A maximum width of the light passage opening 24 in the X-axis direction is wider than a maximum width of the mirror surface 22a in the X-axis direction. The maximum width W1 of the light passage opening 24 in the Y-axis direction is wider than the maximum width of the mirror surface 22a in the Y-axis direction.

Next, the second elastic support unit 27 will be described. Hereinafter, a position at which the lever 271 and the first torsion bar 276 are connected is set as a connection position A3, and a position at which the lever 271 and the second torsion bar 277 are connected is set as a connection position A4. A position at which the lever 271 and the first link member 272 are connected is set as a connection position B3, and a position at which the lever 271 and the second link member 273 are connected is set as a connection position B4. A position at which the frame portion 222 and the second torsion bar 277 are connected is set as a connection position C2.

For example, the connection position A3 corresponds to the central portion of a connection portion between the lever 271 and the first torsion bar 276, and is a position of an intersection between the central line of the second portion 271b of the lever 271 and the central line of the first torsion bar 276 in this embodiment. For example, the connection position A4 corresponds to the central portion of a connection portion between the lever 271 and the second torsion bar 277, and is a position of an intersection between the central line of the first portion 271a of the lever 271 and the central line of the second torsion bar 277 in this embodiment. For example, the connection position B3 corresponds to the central portion of a connection portion between the lever 271 and the first link member 272, and is a position of an intersection between the central line of the second portion 271b of the lever 271 and the central line of the first link member 272 in this embodiment. In this embodiment, the connection position B3 matches the connection position A3. For example, the connection position B4 corresponds to the central portion of a connection portion between the lever 271 and the second link member 273, and is a position of an intersection between the central line of the first portion 271a of the lever 271 and the central line of the second link member 273 in this embodiment.

For example, the connection position C2 corresponds to the central portion of a connection portion at which the frame portion 222 and the second torsion bar 277 are connected. In a case where the frame portion 222 and the second torsion bar 277 are connected to each other via another element (in this embodiment, the intermediate member 275 and the non-linearity mitigation spring 278) similar to this embodiment, the connection position C2 is a position at which the frame portion 222 and the other element are connected to each other. In this embodiment, the connection position C2 is a position of an intersection between an outer edge (line segment that virtually extends from the outer edge) of the frame portion 222 and the central line of each of the straight portions 278b which are continuous with the frame portion 222. In other words, the connection position C2 is a connection position between the movable unit 22b and the second torsion bar 277.

In the mirror device 20, each of the connection position A3 and the connection position B3 is located on a side opposite to the movable mirror 22 with respect to the center T2 of the light passage opening 24 in the X-axis direction. Each of the connection position A4 and the connection position B4 is located on the movable mirror 22 side with respect to the center T2 of the light passage opening 24 in the X-axis direction.

A maximum width W2 of the light passage opening 25 in the Y-axis direction is defined by a gap between the pair of levers 271 in the Y-axis direction. In this embodiment, the maximum width W2 is a gap between the second portions 271b of the pair of levers 271, and is the same as a length of the first link member 272. The maximum width W2 is greater than a distance D6 between the connection positions C2 in the Y-axis direction.

In the respective levers 271, a distance D7 from the connection position B3 to the connection position A4 in the X-axis direction is longer than a distance D8 from the connection position B3 to the connection position A3 in the X-axis direction. In this embodiment, the connection position A3 and the connection position B3 match each other, and thus the distance D8 is a value of zero. In other words, the first link member 272 is connected to the respective levers 271 at a position closer to the first torsion bar 276 in comparison to the second torsion bar 277.

In the respective levers 271, a distance D9 from the connection position B4 to the connection position A3 in the X-axis direction is longer than a distance D10 from the connection position B4 to the connection position A4 in the X-axis direction. In other words, the second link member 273 is connected to the respective levers 271 at a position closer to the second torsion bar 277 in relation to the first torsion bar 276.

When viewed from the Z-axis direction, an area of the light passage opening 25 is 50% or greater of the area of the mirror surface 22a. More preferably, the area of the light passage opening 25 is 70% or greater than the area of the mirror surface 22a. In this embodiment, when viewed from the Z-axis direction, the area of the light passage opening 25 is greater than the area of the mirror surface 22a. A shape of the light passage opening 25 is linearly symmetric to a straight line (in this embodiment, the axial line R1) that passes through the center of the mirror surface 22a and the center T2 of the light passage opening 25. The first torsion bars 276 and the second torsion bars 277 do not define the light passage opening 25. That is, the first torsion bars 276 and the second torsion bars 277 are disposed outside of the light passage opening 25. A maximum width of the light passage opening 25 in the X-axis direction is wider than a maximum width of the mirror surface 22a in the X-axis direction. The maximum width W2 of the light passage opening 25 in the Y-axis direction is wider than the maximum width of the mirror surface 22a in the Y-axis direction.

[Other Configurations of Mirror Unit]

As illustrated in FIG. 2, FIG. 3, FIG. 4, and FIG. 7, the optical function member 13 includes the third surface 13a (a surface on the one side in the Z-axis direction) that faces the second surface 21b of the base 21, and a fourth surface 13b opposite to the third surface 13a. The optical function member 13 is disposed on the other side in the Z-axis direction with respect to the mirror device 20. When viewed from the Z-axis direction, an outer edge 13c of the optical function member 13 is located outside of an outer edge 21c of the base 21. That is, when viewed from the Z-axis direction, the outer edge 13c of the optical function member 13 surrounds the outer edge 21c of the base 21. The optical function member 13 is integrally formed by a material having transparency with respect to the measurement light L0 and the laser light L10. For example, the optical function member 13 is formed in a rectangular plate shape by glass, and has a size of approximately 15 mm×20 mm×4 mm (thickness). For example, the material of the optical function member 13 is selected in accordance with a sensitivity wavelength of the optical module 1. For example, the material is set to glass in a case where the sensitivity wavelength of the optical module 1 is a near infrared region, and the material is set to silicon in a case where the sensitivity wavelength of the optical module 1 is an intermediate infrared region.

A pair of light transmitting portions 14 and 15 are provided in the optical function member 13. The light transmitting portion 14 is a portion, which faces the light passage opening 24 of the mirror device 20 in the Z-axis direction, in the optical function member 13. The light transmitting portion 15 is a portion, which faces the light passage opening 25 of the mirror device 20 in the Z-axis direction, in the optical function member 13. A surface 14a of the light transmitting portion 14 on the mirror device 20 side, and a surface 15a of the light transmitting portion 15 on the mirror device 20 side are located on the same plane as the third surface 13a. The light transmitting portion (second light passage portion) 14 constitutes a second portion (partial portion) of an optical path between the beam splitter unit 3 and the fixed mirror 16. The light transmitting portion 14 is a portion that corrects an optical path difference that occurs between an optical path between the beam splitter unit 3 and the movable mirror 22, and an optical path between the beam splitter unit 3 and the fixed mirror 16. In this embodiment, the light transmitting portion 15 does not function as a light transmitting portion.

The optical function member 13 includes a fifth surface 13d that faces the movable mirror 22 and the drive unit 23 of the mirror device 20. The fifth surface 13d is located on the fourth surface 13b side in comparison to the third surface 13a. The fifth surface 13d extends to the outer edge 13c of the optical function member 13 when viewed from the Z-axis direction. In this embodiment, the fifth surface 13d extends to a pair of opposite sides which extend in the Y-axis direction in the outer edge 13c of the optical function member 13 while surrounding ends of the respective light transmitting portions 14 and 15 on the mirror device 20 side.

The third surface 13a of the optical function member 13 is joined to the second surface 21b of the base 21 by direct bonding (for example, plasma activation bonding, surface-activated room-temperature bonding (SAB), atomic diffusion bonding (ADB), anodic bonding, fusion bonding, hydrophilic bonding, and the like). In this embodiment, the third surface 13a extends to face a plurality of the electrode pads 211 and 212 provided in the base 21 on both sides of the fifth surface 13d in the Y-axis direction. Here, the fifth surface 13d is located on the fourth surface 13b side in comparison to the third surface 13a, and thus the fifth surface 13d is separated from the mirror device 20 in a region where the fifth surface 13d faces the movable mirror 22 and the drive unit 23. In addition, the surface 14a of the light transmitting portion 14 and the surface 15a of the light transmitting portion 15 respectively face the light passage openings 24 and 25 of the mirror device 20. Accordingly, in the mirror unit 2, when the movable mirror 22 reciprocates in the Z-axis direction, the movable mirror 22 and the drive unit 23 are prevented from coming into contact with the optical function member 13.

A sixth surface 21d, which is separated from the optical function member 13 in a state in which the third surface 13a of the optical function member 13 and the second surface 21b of the base 21 are joined to each other, is provided in the base 21 of the mirror device 20. The sixth surface 21d is separated from the optical function member 13 in a region that includes at least a part of an outer edge of the base 21 when viewed from the Z-axis direction. In this embodiment, the sixth surface 21d is formed by removing the device layer 102 and the intermediate layer 103 along one side, which extends in the Y-axis direction, in the outer edge of the base 21 by etching. In addition, a plurality of reference holes 13e are formed in the third surface 13a of the optical function member 13. In this embodiment, the plurality of reference holes 13e are formed in the third surface 13a to correspond to a plurality of corners of the base 21. When the third surface 13a of the optical function member 13 and the second surface 21b of the base 21 are joined to each other, handling of the mirror device 20 is performed in a state in which a portion of the base 21 which corresponds to the sixth surface 21d is gripped, and thus a position of the mirror device 20 in the X-axis direction and the Y-axis direction, and an angle of the mirror device 20 in a plane perpendicular to the Z-axis direction are adjusted based on the plurality of reference holes 13e.

As illustrated in FIG. 3 and FIG. 4, the fixed mirror 16 is disposed on the other side (side opposite to the mirror device 20) in the Z-axis direction with respect to the optical function member 13, and a position of the mirror device 20 with respect to the base 21 is fixed. For example, the fixed mirror 16 is formed on the fourth surface 13b of the optical function member 13 by vapor deposition. The fixed mirror 16 includes a mirror surface 16a perpendicular to the Z-axis direction. In this embodiment, the mirror surface 22a of the movable mirror 22, and the mirror surface 16a of the fixed mirror 16 face one side (beam splitter unit 3 side) in the Z-axis direction. The fixed mirror 16 is formed continuously with the fourth surface 13b of the optical function member 13 to reflect light that is transmitted through the respective light transmitting portions 14 and 15 of the optical function member 13. However, a fixed mirror that reflects light transmitted through the light transmitting portion 14, and a fixed mirror that reflects light transmitted through the light transmitting portion 15 may be provided, respectively.

The stress mitigation substrate 17 is attached to the fourth surface 13b of the optical function member 13 via the fixed mirror 16. For example, the stress mitigation substrate 17 is attached to the fixed mirror 16, for example, by an adhesive. When viewed from the Z-axis direction, an outer edge of the stress mitigation substrate 17 is located outside of the outer edge 13c of the optical function member 13. That is, when viewed from the Z-axis direction, the outer edge of the stress mitigation substrate 17 surrounds the outer edge 13c of the optical function member 13. A thermal expansion coefficient of the stress mitigation substrate 17 is closer to a thermal expansion coefficient of the base 21 of the mirror device 20 (more specifically, a thermal expansion coefficient of the support layer 101) in comparison to a thermal expansion coefficient of the optical function member 13. In addition, the thickness of the stress mitigation substrate 17 is closer to the thickness of the base 21 of the mirror device 20 in comparison to the thickness of the optical function member 13. For example, the stress mitigation substrate 17 is formed in a rectangular plate shape by silicon, and has a size of approximately 16 mm×21 mm×0.65 mm (thickness).

Figure 8:
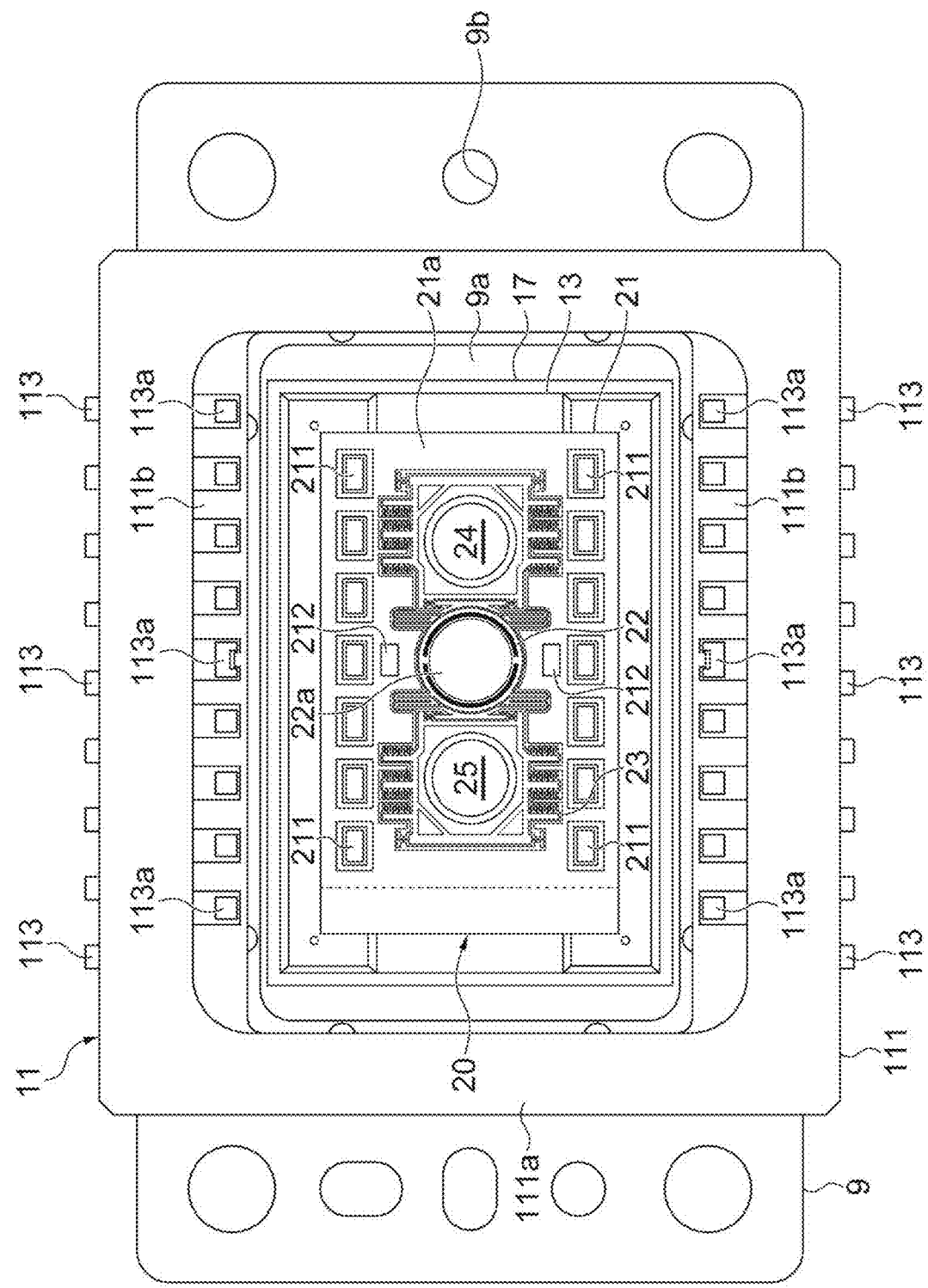
FIG. 8 is a cross-sectional view of the optical module which is taken along line VIII-VIII illustrated in FIG. 1.

As illustrated in FIG. 1, the mirror unit 2 configured as described above is attached to the support 9 by fixing a surface of the stress mitigation substrate 17 on a side opposite to the optical function member 13 to a surface 9a of the support 9 (surface on the one side in the Z-axis direction), for example, by an adhesive. When the mirror unit 2 is attached to the support 9, as illustrated in FIG. 8, a position of the mirror device 20 in the X-axis direction and the Y-axis direction and an angle of the mirror device 20 in a plane perpendicular to the Z-axis direction are adjusted based on a reference hole 9b that is formed in the support 9. In FIG. 8, the second support structure 12 is not illustrated.

[Configuration of First Support Structure and Beam Splitter Unit]

As illustrated in FIG. 1 and FIG. 8, the first support structure 11 includes a frame body 111, a light transmitting member 112, and a plurality of lead pins 113. The frame body 111 is formed so as to surround the mirror unit 2 when viewed from the Z-axis direction, and is attached to the surface 9a of the support 9, for example, by an adhesive such as silver solder. For example, the frame body 111 is formed of ceramic, and has a rectangular frame shape. An end surface 111a of the frame body 111 on a side opposite to the support 9 is located on a side opposite to the support 9 in comparison to the first surface 21a of the base 21 of the mirror device 20.

The light transmitting member 112 is formed so as to close an opening of the frame body 111, and is attached to the end surface 111a of the frame body 111, for example, with an adhesive. The light transmitting member 112 is formed of a material having transparency with respect to the measurement light L0 and the laser light L10, and has a rectangular plate shape for example. Here, the end surface 111a of the frame body 111 is located on a side opposite to the support 9 in comparison to the first surface 21a of the base 21 of the mirror device 20, and thus the light transmitting member 112 is separated from the mirror device 20. Accordingly, in the optical module 1, when the movable mirror 22 reciprocates in the Z-axis direction, the movable mirror 22 and the drive unit 23 are prevented from coining into contact with the light transmitting member 112. In the optical module 1, the support 9, the frame body 111, and the light transmitting member 112 constitute a package that accommodates the mirror unit 2.

The respective lead pins 113 are provided in the frame body 111 in such a manner that one end 113a is located inside of the frame body 111, and the other end (not illustrated) is located outside of the frame body 111. The one ends 113a of the lead pins 113 are electrically connected to the electrode pads 211 and 212 corresponding to the lead pins 113 in the mirror device 20 by wires (not illustrated). In the optical module 1, an electric signal for moving the movable mirror 22 in the Z-axis direction is input to the drive unit 23 through the plurality of lead pins 113. In this embodiment, a stepped surface 111b that extends in the X-axis direction on both sides of the optical function member 13 in the Y-axis direction is formed in the frame body 111, and one end 113a of each of the lead pins 113 is disposed on the stepped surface 111b. The lead pin 113 extends in the Z-axis direction on both sides of the support 9 in the Y-axis direction, and the other end of the lead pin 113 is located on the other side in the Z-axis direction in comparison to the support 9.

Figure 10:
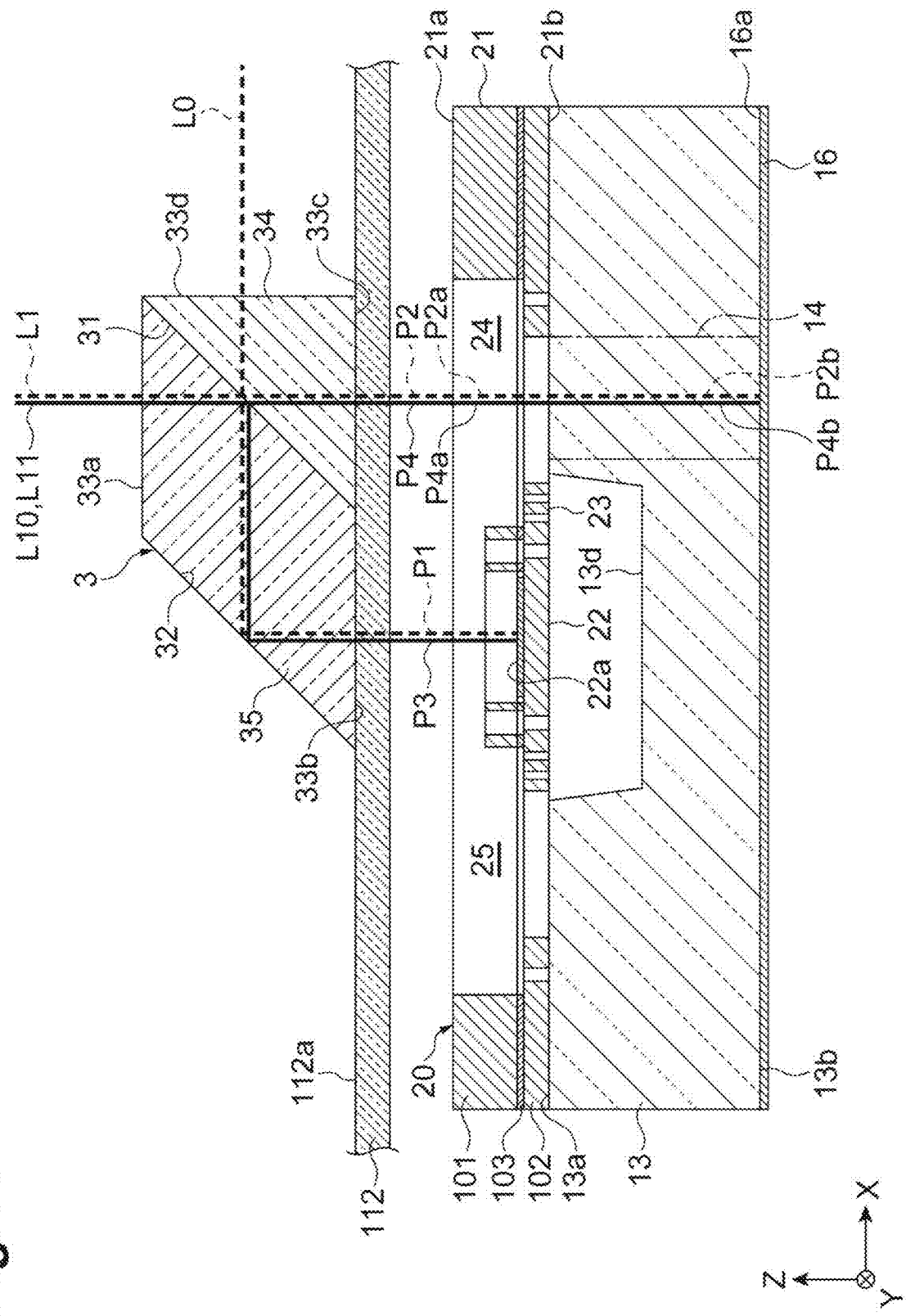
FIG. 10 is a schematic cross-sectional view of the mirror unit and a beam splitter unit which are illustrated in FIG. 1.

As illustrated in FIG. 10, the beam splitter unit 3 is attached to a surface 112a of the light transmitting member 112 on a side opposite to the mirror device 20, for example, by an optical adhesive that also functions as a refractive index matching agent. The beam splitter unit 3 includes a first mirror surface 31, a second mirror surface 32, and a plurality of optical planes 33a, 33b, 33c, and 33d. The beam splitter unit 3 is constituted by joining a plurality of optical blocks 34 and 35. The respective optical blocks 34 and 35 are formed of a material having a refractive index that is the same as or similar to that of the optical function member 13. FIG. 10 is a schematic cross-sectional view of the mirror unit 2 and the beam splitter unit 3 illustrated in FIG. 1, and in FIG. 10, the mirror device 20 is schematically illustrated, for example, in a state in which dimensions in the Z-axis direction are enlarged in comparison to actual dimensions.

The first mirror surface 31 is a mirror surface (for example, a half mirror surface) that is inclined with respect to the Z-axis direction, and is formed between the optical block 34 and the optical block 35. In this embodiment, the first mirror surface. 31 is a surface that is parallel to the Y-axis direction, has an angle of 45° with respect to the Z-axis direction, and is inclined to be spaced away from the light incident unit 4 as it approaches the mirror device 20. The first mirror surface 31 has a function of reflecting a part of the measurement light L0 and allowing the remainder of the measurement light L0 to be transmitted therethrough, and a function of reflecting a part of the laser light L10 and allowing the remainder of the laser light L10 to be transmitted therethrough. For example, the first mirror surface 31 is formed of a dielectric multi-layer film. The first mirror surface 31 overlaps the light passage opening 24 of the mirror device 20, the light transmitting portion 14 of the optical function member. 13, and the mirror surface 16a of the fixed mirror 16 when viewed from the Z-axis direction, and overlaps the light incident unit 4 when viewed form the X-axis direction (refer to FIG. 1). That is, the first mirror surface 31 faces the fixed mirror 16 in the Z-axis direction, and faces the light incident unit 4 in the X-axis direction.

The second mirror surface 32 is a mirror surface (for example, a total reflection mirror surface) that is parallel to the first mirror surface 31, and is formed in the optical block 35 to be located on a side opposite to the light incident unit 4 with respect to the first mirror surface 31. The second mirror surface 32 has a function of reflecting the measurement light L0 and a function of reflecting the laser light L10. For example, the second mirror surface 32 is formed of a metal film. The second mirror surface 32 overlaps the mirror surface 22a of the movable mirror 22 of the mirror device 20 when viewed from the Z-axis direction, and overlaps the first mirror surface 31 when viewed from the X-axis direction. That is, the second mirror surface 32 faces the movable mirror 22 in the Z-axis direction, and faces the first mirror surface 31 in the X-axis direction.

The optical plane 33a is a plane perpendicular to the Z-axis direction, and is formed in the optical block 35 to be located on a side opposite to the mirror device 20 with respect to the first mirror surface 31. The optical plane 33b is a plane perpendicular to the Z-axis direction, and is formed in the optical block 35 to be located on the mirror device 20 side with respect to the second mirror surface 32. The optical plane 33c is a plane perpendicular to the Z-axis direction, and is formed in the optical block 34 to be located on the mirror device 20 side with respect to the first mirror surface 31. The optical surface 33b and the optical surface 33c are located on the same plane. The optical surface 33d is a plane perpendicular to the X-axis direction, and is formed in the optical block 34 to be located on the light incident unit 4 side with respect to the first mirror surface 31. The respective optical surfaces 33a, 33b, 33c, and 33d have a function of allowing the measurement light L0 to be transmitted therethrough, and a function of allowing the laser light L10 to be transmitted therethrough.

Figure 9:
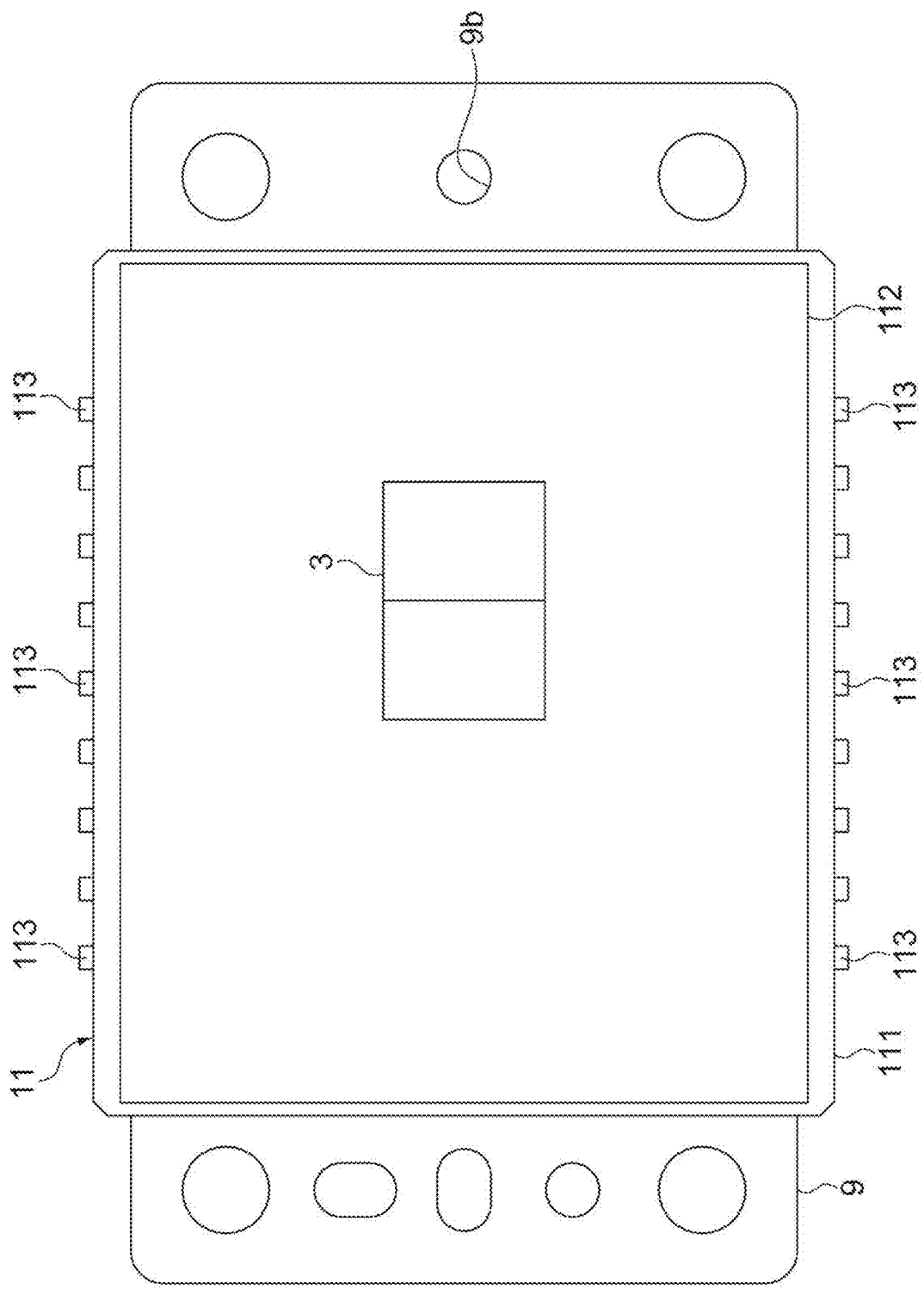
FIG. 9 is a cross-sectional view of the optical module which is taken along line IX-IX illustrated in FIG. 1.

The beam splitter unit 3 configured as described above is attached to the light transmitting member 112 by fixing the optical surface 33b and the optical surface 33c which are located on the same plane to the surface 112a of the light transmitting member 112, for example, by an optical adhesive. When the beam splitter unit 3 is attached to the light transmitting member 112, as illustrated in FIG. 9, a position of the beam splitter unit 3 in the X-axis direction and the Y-axis direction, and an angle of the beam splitter unit 3 in a plane perpendicular to the Z-axis direction are adjusted based on the reference hole 9b formed in the support 9. In FIG. 9, the second support structure 12 is not illustrated.

Here, the optical path of the measurement light L0 and the optical path of the laser light L10 in the mirror unit 2 and the beam splitter unit 3 will be described in detail with reference to FIG. 10.

As illustrated in FIG. 10, when the measurement light L0 is incident to the beam splitter unit 3 in the X-axis direction through the optical surface 33d, a part of the measurement light L0 is transmitted through the first mirror surface 31, is reflected by the second mirror surface 32, and reaches the mirror surface 22a of the movable mirror 22 through the optical surface 33b and the light transmitting member 112. The part of the measurement light L0 is reflected by the mirror surface 22a of the movable mirror 22, and proceeds on the same optical path P1 in an opposite direction, and is reflected by the first mirror surface 31. The remainder of the measurement light L0 is reflected by the first mirror surface 31, and reaches the mirror surface 16a of the fixed mirror 16 through the optical surface 33c, the light transmitting member 112, the light passage opening 24 of the mirror device 20, and the light transmitting portion 14 of the optical function member 13. The remainder of the measurement light L0 is reflected by the mirror surface 16a of the fixed mirror 16, proceeds on the same optical path P2 in an opposite direction, and is transmitted through the first mirror surface 31. The part of the measurement light L0 which is reflected by the first mirror surface 31, and the remainder of the measurement light L0 which is transmitted through the first mirror surface 31 become interference light L1, and the interference light L1 of the measurement light is emitted from the beam splitter unit 3 through the optical surface 33a along the Z-axis direction.

On the other hand, when the laser light L10 is incident to the beam splitter unit 3 in the Z-axis direction through the optical surface 33a, a part of the laser light L10 is reflected by the first mirror surface 31 and the second mirror surface 32, and reaches the mirror surface 22a of the movable mirror 22 through the optical surface 33b and the light transmitting member 112. The part of the laser light L10 is reflected by the mirror surface 22a of the movable mirror 22, proceeds on the same optical path P3 in an opposite direction, and is reflected by the first mirror surface 31. The remainder of the laser light L10 is transmitted through the first mirror surface 31, and reaches the mirror surface 16a of the fixed mirror 16 through the optical surface 33c, the light transmitting member 112, the light passage opening 24 of the mirror device 20, and the light transmitting portion 14 of the optical function member 13. The remainder of the laser light L10 is reflected by the mirror surface 16a of the fixed mirror 16, proceeds on the same optical path P4 in an opposite direction, and is transmitted through the first mirror surface 31. The part of the laser light L10 which is reflected by the first mirror surface 31, and the remainder of the laser light L10 which is transmitted through the first mirror surface 31 become interference light L11, and the interference light L11 of the laser light is emitted from the beam splitter unit 3 through the optical surface 33a along the Z-axis direction.

As described above, the light passage opening 24 of the mirror device 20 constitutes a first portion P2a of the optical path P2 of the measurement light L0 and a first portion P4a of the optical path P4 of the laser light L10 in an optical path between the beam splitter unit 3 and the fixed mirror 16. In addition, the light transmitting portion 14 of the optical function member 13 constitutes a second portion P2b of the optical path P2 of the measurement light L0 and a second portion P4b of the optical path P4 of the laser light L10 in the optical path between the beam splitter unit 3 and the fixed mirror 16.

The second portion P2b of the optical path P2 of the measurement light L0 is constituted by the light transmitting portion 14, thus an optical path difference between both the optical paths P1 and P2 is corrected so that a difference between an optical path length (optical path length in consideration of a refractive index of respective media through which the optical path passes) of the optical path P1 of the measurement light L0, and an optical path length of the optical path P2 of the measurement light L0 decreases. Similarly, the second portion P4b of the optical path P4 of the laser light L10 is constituted by the light transmitting portion 14, thus an optical path difference between both the optical paths P3 and P4 is corrected so that a difference between an optical path length of the optical path P3 of the laser light L10 and an optical path length of the optical path P4 of the laser light L10 decreases. In this embodiment, a refractive index of the light transmitting portion 14 is the same as a refractive index of the respective optical blocks which constitute the beam splitter unit 3, and a distance between the first mirror surface 31 and the second mirror surface 32 in the X-axis direction is the same as the thickness of the light transmitting portion 14 in the Z-axis direction (that is, a distance between the surface 14a of the light transmitting portion 14 and the fourth surface 13b of the optical function member 13 in the Z-axis direction).

[Configuration of Second Support Structure, Light Incident Unit, and the Like]

As illustrated in FIG. 1, the second support structure 12 includes a connection unit 120. The connection unit 120 includes a main body portion 121, a frame body 122, and a fixing plate 123. The main body portion 121 includes a pair of side wall portions 124 and 125, and a ceiling wall portion 126. The pair of side wall portions 124 and 125 face each other in the X-axis direction. An opening 124a is formed in the side wall portion 124 on one side in the X-axis direction. The ceiling wall portion 126 faces the support 9 in the Z-axis direction. An opening 126a is formed in the ceiling wall portion 126. For example, the main body portion 121 is integrally formed of a metal. Positioning pins 121a are provided in the main body portion 121. The main body portion 121 is positioned with respect to the support 9 by inserting the positioning pin 121*a* into the reference hole 9*b* formed in the support 9, and is attached to the support 9 in this state, for example, by a bolt.

The frame body 122 is disposed on a surface of the side wall portion 124 on a side opposite to the beam splitter unit 3. An opening of the frame body 122 faces the beam splitter unit 3 through the opening 124*a* of the side wall portion 124. The light incident unit 4 is disposed in the frame body 122. The fixing plate 123 is a member that fixes the light incident unit 4 disposed in the frame body 122 to the main body portion 121 (details will be described later).

The second support structure 12 further includes a holding unit 130. The holding unit 130 includes a main body portion 131, a frame body 132 and a fixing plate 133. The main body portion 131 is attached to a surface of the ceiling wall portion 126 which is opposite to the support 9. For example, the main body portion 131 is positioned with respect to the main body portion 121 of the connection unit 120 by a positioning pin, and is attached to the ceiling wall portion 126 in this state, for example, by a bolt. A concave portion 134 is formed in a surface of the main body portion 131 which is opposite to the support 9. A first light passage hole 135, a second light passage hole 136, and a third light passage hole 137 are formed in a bottom surface of the concave portion 134. The first light passage hole 135 is formed at a position that faces the first mirror surface 31 of the beam splitter unit 3 in the Z-axis direction. The second light passage hole 136 is formed on the other side of the first light passage hole 135 in the X-axis direction (that is, on a side opposite to the light incident unit 4). The third light passage hole 137 is formed on the other side of the second light passage hole 136 in the X-axis direction.

The frame body 132 is disposed on the bottom surface of the concave portion 134. An opening of the frame body 132 faces the third light passage hole 137. The second light source 7 is disposed in the frame body 132. The first light detector 6 is disposed on the bottom surface of the concave portion 134 in a state of facing the first light passage hole 135. The second light detector 8 is disposed on the bottom surface of the concave portion 134 in a state of facing the second light passage hole 136. The fixing plate 133 is a member that fixes the first light detector 6 and the second light detector 8 which are disposed on the bottom surface of the concave portion 134, and the second light source 7 that is disposed in the frame body 132 to the main body portion 131 (details will be described later).

The light incident unit 4 includes a holder 41 and a collimator lens 42. The holder 41 holds the collimator lens 42, and is configured so that an optical fiber (not illustrated) that guides the measurement light L0 can be connected to the holder 41. The collimator lens 42 collimates the measurement light L0 emitted from the optical fiber. When the optical fiber is connected to the holder 41, an optical axis of the optical fiber matches an optical axis of the collimator lens 42.

A flange portion 41*a* is provided in the holder 41. The flange portion 41*a* is disposed between the frame body 122 and the fixing plate 123. In this state, fixing plate 123 is attached to the side wall portion 124, for example, by a bolt, and the light incident unit 4 disposed in the frame body 122 is fixed to the main body portion 121. In this manner, the light incident unit 4 is disposed on one side of the beam splitter unit 3 in the X-axis direction, and is supported by the second support structure 12. The light incident unit 4 allows measurement light L0 that is incident from the first light source through a measurement target or measurement light L0 that is generated from the measurement target (in this embodiment, the measurement light L0 guided by the optical fiber) to be incident to the beam splitter unit 3.

A filter 54 is attached to the frame body 122. The filter 54 has a function of cutting off the laser light L10. The filter 54 is disposed in the opening 124*a* of the side wall portion 124 in a state of being inclined with respect to an optical axis of the light incident unit 4. The filter 54 closes the opening of the frame body 122 when viewed form the X-axis direction. In this manner, the filter 54 is disposed between the light incident unit 4 and the beam splitter unit 3, and is supported by the second support structure 12 in a state of being inclined with respect to an optical axis of the light incident unit 4. In this embodiment, an optical surface of the filter 54 is a surface that is parallel to the Z-axis direction and has an angle of 10° to 20° with respect to the Y-axis direction. The optical axis of the light incident unit 4 is parallel to the X-axis direction.

Accordingly, even when light in the same wavelength range as the laser light L10 is included in the measurement light L0, the light is prevented from being incident to the beam splitter unit 3, and thus it is possible to obtain a position of the movable mirror 22 in the Z-axis direction with accuracy based on a detection result of the interference light L11 of the laser light. In addition, since the filter 54 is inclined with respect to the optical axis of the light incident unit 4, light in the same wavelength range as the laser light 110 is reflected to the outside of an interference optical system, and thus it is possible to reliably prevent the light from being stray light. In this embodiment, light in the same wavelength range as the laser light L10 emitted from the beam splitter unit 3 in the X-axis direction is reflected by the filter 54, and is emitted to the outside of the interference optical system from between the pair of side wall portions 124 and 125 in the main body portion 121 of the second support structure 12. Accordingly, it is possible to reliably prevent the light from being stray light.

The first light detector 6 includes a holder 61, a light detection element 62, and a condensing lens 63. The holder 61 holds the light detection element 62 and the condensing lens 63. The light detection element 62 detects the interference light L1 of the measurement light. For example, the light detection element 62 is an InGaAs photodiode. The condensing lens 63 condenses the interference light L1 of the measurement light incident to the light detection element 62 to the light detection element 62. In the holder 61, an optical axis of the light detection element 62 and an optical axis of the condensing lens 63 match each other.

A flange portion 61*a* is provided in the holder 61. The flange portion 61*a* is disposed between the bottom surface of the concave portion 134 of the main body portion 131, and the fixing plate 133. In this state, the fixing plate 133 attached to the main body portion 131, for example, by a bolt, and thus the first light detector 6 disposed on the bottom surface of the concave portion 134 is fixed to the main body portion 131. In this manner, the first light detector 6 is disposed on one side of the beam splitter unit 3 in the Z-axis direction, and is supported by the second support structure 12. The first light detector 6 faces the first mirror surface 31 of the beam splitter unit 3 in the Z-axis direction. The first light detector 6 detects the interference light L1 of the measurement light emitted from the beam splitter unit 3.

The second light detector 8 includes a holder 81, a light detection element 82, and a condensing lens 83. The holder 81 holds the light detection element 82 and the condensing lens 83. The light detection element 82 detects the interference light L11 of the laser light. For example, the light detection element 82 is a Si photodiode. The condensing lens 83 condenses the interference light Lit of the laser light incident to the light detection element 82 to the light detection element 82. In the holder 81, an optical axis of the light detection element 82 and an optical axis of the condensing lens 83 match each other.

A flange portion 81a is provided in the holder 81. The flange portion 81a is disposed between the bottom surface of the concave portion 134 of the main body portion 131, and the fixing plate 133. In this state, the fixing plate 133 attached to the main body portion 131, for example, by a bolt, and thus the second light detector 8 disposed on the bottom surface of the concave portion 134 is fixed to the main body portion 131. In this manner, the second light detector 8 is disposed on one side of the beam splitter unit 3 in the Z-axis direction, and is supported by the second support structure 12. The second light detector 8 detects the interference light L11 of the laser light emitted from the beam splitter unit 3.

The second light source 7 includes a holder 71, a light-emitting element 72, and a collimator lens 73. The holder 71 holds the light-emitting element 72 and the collimator lens 73. The light-emitting element 72 emits the laser light L10. For example, the light-emitting element 72 is a semiconductor laser such as a VCSEL. The collimator lens 73 collimates the laser light L10 emitted from the light-emitting element 72. In the holder 71, an optical axis of the light-emitting element 72 and an optical axis of the collimator lens 73 match each other.

A flange portion 71a is provided in the holder 71. The flange portion 71a is disposed between the frame body 132 and the fixing plate 133. In this state, the fixing plate 133 is attached to the main body portion 131, for example, by a bolt, and thus the second light source 7 disposed in the frame body 132 is fixed to the main body portion 131. In this manner, the second light source 7 is disposed on one side of the beam splitter unit 3 in the Z-axis direction, and is supported by the second support structure 12. The second light source 7 emits the laser light L10 that is to be incident to the beam splitter unit 3.

As described above, the holding unit 130 holds the first light detector 6, the second light detector 8, and the second light source 7 so that the first light detector (first optical device) 6, the second light detector (second optical device) 8, and the second light source (third optical device) 7 face the same side, and the first light detector 6, the second light detector 8, and the second light source 7 are aligned in this order. In this embodiment, on one side of the beam splitter unit 3 in the Z-axis direction, the holding unit 130 holds the first light detector 6, the second light detector 8, and the second light source 7 so that the first light detector 6, the second light detector 8, and the second light source 7 face the other side (that is, the beam splitter unit 3 side). In addition, the holding unit 130 holds the first light detector 6, the second light detector 8, and the second light source 7 so that the first light detector 6, the second light detector 8, and the second light source 7 are aligned in this order from one side (that is, the light incident unit 4 side) in the X-axis direction.

A first mirror 51, a second mirror 52, and a third mirror 53 are attached to the main body portion 131 of the holding unit 130. The first mirror 51 is held by the holding unit 130 to be located on a side opposite to the first light detector 6 with respect to the first light passage hole 135. The second mirror 52 is held by the holding unit 130 to be located on a side opposite to the second light detector 8 with respect to the second light passage hole 136. The third mirror 53 is held by the holding unit 130 to be located on a side opposite to the second light source 7 with respect to the third light passage hole 137.

The first mirror 51 is a dichroic mirror that has a function of allowing the measurement light L0 to be transmitted therethrough and of reflecting the laser light L10, and is inclined with respect to the optical axis of the first light detector 6. The first mirror 51 is disposed between the beam splitter unit 3 and the first light detector 6. That is, the first mirror 51 is disposed to face the beam splitter unit 3 and the first light detector 6. In this embodiment, an optical surface of the first mirror 51 is a surface that is parallel to the Y-axis direction and has an angle of 45° with respect to the Z-axis direction. The optical axis of the first light detector 6 is parallel to the Z-axis direction.

The second mirror 52 is a mirror (for example, a half mirror) that has a function of reflecting a part of the laser light L10 and allowing the remainder of the laser light L10 to be transmitted therethrough, and is parallel to the first mirror 51. The second mirror 52 is disposed to overlap the first mirror 51 when viewed from the X-axis direction, and to overlap the second light detector 8 when viewed from the Z-axis direction. That is, the second mirror 52 is disposed to face the first mirror 51 and the second light detector 8. In this embodiment, an optical surface of the second mirror 52 is a surface that is parallel to the Y-axis direction, and has an angle of 45° with respect to the Z-axis direction.

The third mirror 53 is a mirror (for example, a total reflection mirror) that has a function of reflecting the laser light L10 and is parallel to the second mirror 52. The third mirror 53 is disposed to overlap the second mirror 52 when viewed from the X-axis direction, and overlap the second light source 7 when viewed from the Z-axis direction. That is, the third mirror 53 is disposed to face the second mirror 52 and the second light source 7. In this embodiment, an optical surface of the third mirror 53 is a surface that is parallel to the Y-axis direction, and has an angle of 45° with respect to the Z-axis direction.

An aperture 55 is attached to the main body portion 131 of the holding unit 130. The aperture 55 is held by the holding unit 130 to be located between the first mirror 51 and the first light detector 6. The aperture 55 is a member in which an opening having a circular shape is formed when viewed from the Z-axis direction, and is disposed in the first light passage hole 135.

The interference light L1 of the measurement light, which is emitted from the beam splitter unit 3 in the Z-axis direction, is transmitted through the first mirror 51, is incident to the first light detector 6 through the aperture 55, and is detected by the first light detector 6. On the other hand, the laser light L10 emitted from the second light source 7 is reflected by the third mirror 53, is transmitted through the second mirror 52, is reflected by the first mirror 51, and is incident to the beam splitter unit 3 in the Z-axis direction. The interference light L11 of the laser light, which is emitted from the beam splitter unit 3 in the Z-axis direction, is reflected by the first mirror 51 and the second mirror 52, is incident to the second light detector 8, and is detected by the second light detector 8.

[Function and Effect]

In the above-described mirror device 20, the first link member 262 bridges the pair of levers 261, and the light passage opening 24 is defined by the respective levers 261 and the first link member 262. In addition, the first link member 272 bridges the pair of levers 271, and the light passage opening 25 is defined by the respective levers 271 and the first link member 272. Accordingly, an optical path can be set to pass through the light passage opening 24 or 25, and it is possible to miniaturize the entirety of a device, for example, in comparison to a case where the optical path is set to pass through outside of the mirror device 20. In addition, the first link member 262 bridges the pair of levers 261, and the first link member 272 bridges the pair of levers 271, and thus it is possible to improve external force resistance of the first elastic support unit 26 and the second elastic support unit 27. Accordingly, for example, it is possible to suppress an influence on an operation of the movable mirror 22 or contact risk between the movable comb-teeth 282a and 284a and the fixed comb-teeth 281a and 283a due to vibration or impact from outside, and thus it is possible to stabilize the operation of the movable mirror 22. As a result, it is possible to improve control characteristics of the movable mirror 22. In addition, the connection positions A1 between the pair of levers 261 and the pair of first torsion bars 266 are located on a side opposite to the movable unit 22b with respect to the center T1 of the light passage opening 24 in the X-axis direction, and the maximum width W1 of the light passage opening 24 in the Y-axis direction is defined by a gap between the pair of levers 261 in the Y-axis direction. In addition, the connection positions A3 between the pair of levers 271 and the pair of first torsion bars 276 are located on a side opposite to the movable unit 22b with respect to the center T2 of the light passage opening 25 in the X-axis direction, and the maximum width W2 of the light passage opening 25 in the Y-axis direction is defined by a gap between the pair of levers 271 in the Y-axis direction. Accordingly, it is possible to secure the size of the light passage openings 24 and 25, and thus it is possible to secure optical performance. As a result, according to the mirror device 20, the miniaturization of the entirety of a device, the improvement of external force resistance of the first elastic support unit 26 and the second elastic support unit 27, and the securement of the optical performance are realized.

The light passage opening 24 is defined by the pair of levers 261, the first link member 262, and the second link member 263, and the light passage opening 25 is defined by the pair of levers 271, the first link member 272, and the second link member 273. Accordingly, it is possible to further improve the external force resistance of the first elastic support unit 26 and the second elastic support unit 27.

The pair of beam members 264 respectively bridge the pair of levers 261 and the first link member 262, and the pair of beam members 274 respectively bridge the pair of levers 271 and the first link member 272. Accordingly, it is possible to further improve the external force resistance of the first elastic support unit 26 and the second elastic support unit 27.

Each of the first torsion bars 266 is connected to the first ends 261d of the pair of levers 261, and each of the second torsion bars 267 is connected to the second ends 261e of the pair of levers 261. In addition, each of the first torsion bars 276 is connected to the first ends 271d of the pair of levers 271, and each of the second torsion bars 277 is connected to the second ends 271e of the pair of levers 271. Accordingly, it is possible to secure the size of the light passage openings 24 and 25 more preferably.

The maximum width W1 of the light passage opening 24 in the Y-axis direction is greater than the distance D1 (distance between connection positions of the movable unit 22b and the pair of second torsion bars 267) between the connection positions C1 of the frame portion 222 and the pair of second torsion bars 267 in the Y-axis direction. In addition, the maximum width W2 of the light passage opening 25 in the Y-axis direction is greater than the distance D6 (distance between connection positions of the movable unit 22b and the pair of second torsion bars 277) between connection positions C2 of the frame portion 222 and the pair of second torsion bars 277 in the Y-axis direction. Accordingly, it is possible to secure the size of the light passage openings 24 and 25 in the Y-axis direction more preferably.

In each of the levers 261, the distance D2 from the connection position B1 with the first link member 262 to the connection position A2 with each of the pair of second torsion bars 267 in the X-axis direction is longer than the distance D3 from the connection position B1 with the first link member 262 to the connection position A1 with each of the pair of first torsion bars 266 in the X-axis direction. Accordingly, it is possible to secure the size of the light passage opening 24 in a direction along the pair of levers 261 more preferably. In addition, in each of the levers 271, the distance D7 from the connection position B3 with the first link member 272 to the connection position A4 with each of the pair of second torsion bars 277 in the X-axis direction is longer than the distance D8 from the connection position B3 with the first link member 272 to the connection position A3 with each of the pair of first torsion bars 276 in the X-axis direction. Accordingly, it is possible to secure the size of the light passage opening 24 in a direction along the pair of levers 271 more preferably.

[Modification Examples]

Figure 11:
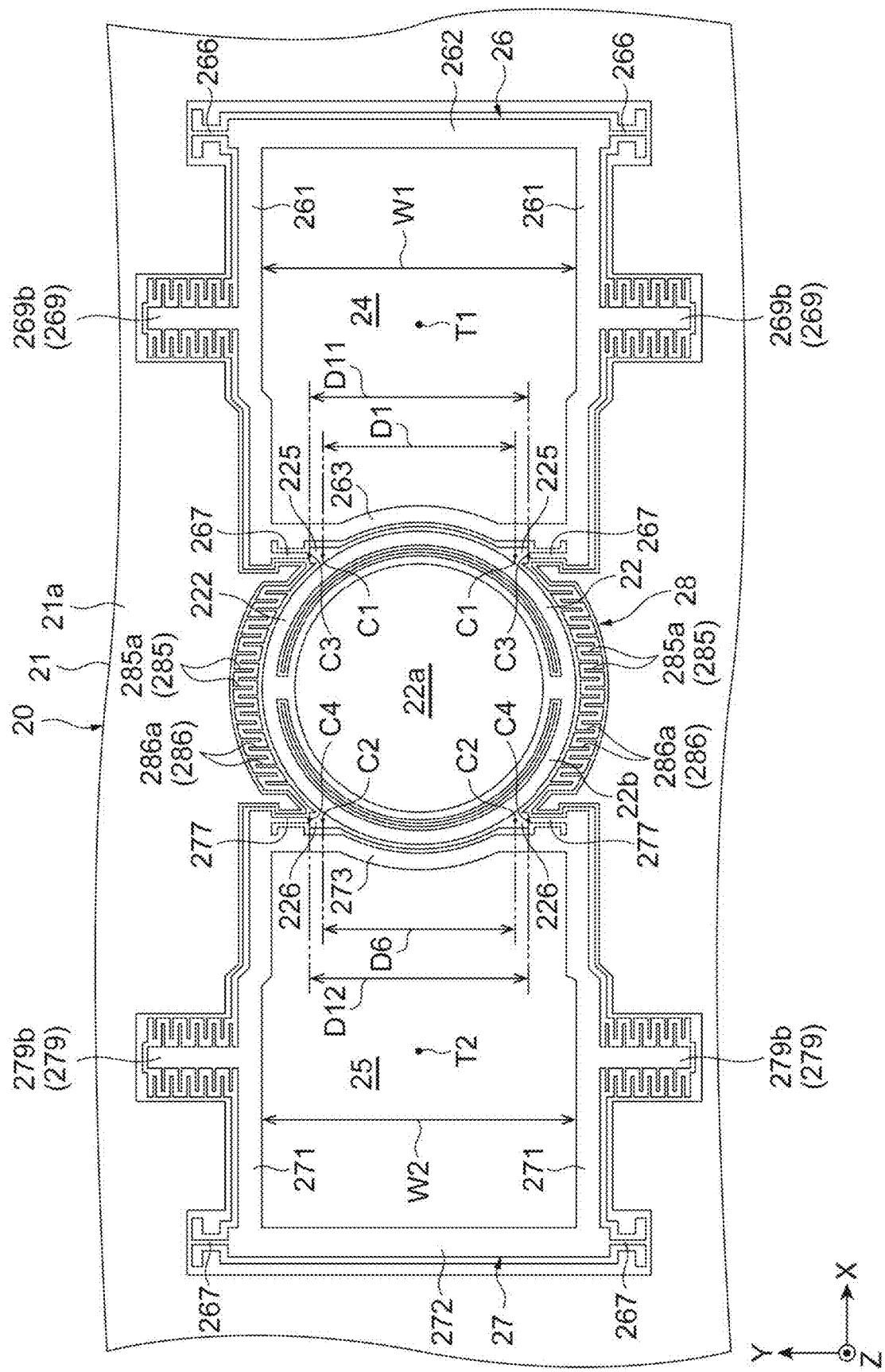
FIG. 11 is a plan view of a mirror device of a first modification example.

The mirror device 20 may have a configuration similar to a first modification example illustrated in FIG. 11. In the first modification example, the movable unit 22b further includes a pair of brackets 225 and a pair of brackets 226. The respective brackets 225 and the respective brackets 226 are formed at a part of the device layer 102.

The respective brackets 225 extend in the Y-axis direction, and have a rectangular shape when viewed from the Z-axis direction. One of the brackets 225 protrudes from a lateral surface of the frame portion 222 toward one side in the Y-axis direction, and the other bracket 225 protrudes from the lateral surface of the frame portion 222 toward the other side in the Y-axis direction. The pair of brackets 225 are disposed on the same central line parallel to the Y-axis direction. The respective brackets 225 are disposed on the light passage opening 24 side with respect to the center of the mirror surface 22a.

The respective brackets 226 extend in the Y-axis direction, and have a rectangular shape when viewed from the Z-axis direction. One of the brackets 226 protrudes from a lateral surface of the frame portion 222 toward one side in the Y-axis direction, and the other bracket 226 protrudes from the lateral surface of the frame portion 222 toward the other side in the Y-axis direction. The pair of brackets 226 are disposed on the same central line parallel to the Y-axis direction. The respective brackets 226 are disposed on the light passage opening 25 side with respect to the center of the mirror surface 22a.

The first elastic support unit 26 does not include the pair of beam members 264, the intermediate member 265, and the pair of non-linearity mitigation springs 268. Both ends of the second link member 263 extend in the Y-axis direction. An intermediate portion of the second link member 263 extends along the frame portion 222, and is curved in a convex shape toward a side opposite to the movable mirror 22. The pair of second torsion bars 267 are respectively connected to tip ends of the pair of brackets 225. That is, the pair of second torsion bars 267 are respectively connected between the pair of levers 261 and the movable mirror 22.

The electrode support portion 269 includes only the pair of second electrode support portions 269b.

The second elastic support unit 27 does not include the pair of beam members 274, the intermediate member 275, and the pair of non-linearity mitigation springs 278. Both ends of the second link member 273 extend in the Y-axis direction. An intermediate portion of the second link member 273 extends along the frame portion 222, and is curved in a convex shape toward a side opposite to the movable mirror 22. The pair of second torsion bars 277 are respectively connected to tip ends of the pair of brackets 226. That is, the pair of second torsion bars 277 are respectively connected between the pair of levers 271 and the movable mirror 22. The electrode support portion 279 includes only the pair of second electrode support portions 279b.

The actuator unit 28 further includes a fixed comb-tooth electrode 285 and a movable comb-tooth electrode 286. The fixed comb-tooth electrode 285 is disposed along an outer edge of the movable mirror 22 (along the frame portion 222). The fixed comb-tooth electrode 285 is provided on a surface of the device layer 102 of the base 21 which faces an outer surface of the frame portion 222 in the Y-axis direction. The fixed comb-tooth electrode 285 includes a plurality of fixed comb-teeth 285a which extend along a plane perpendicular to the X-axis direction. The fixed comb-teeth 285a are aligned in the X-axis direction with a predetermined gap.

The movable comb-tooth electrode 286 is disposed along an outer edge of the movable mirror 22 (along the frame portion 222). The movable comb-tooth electrode 286 is provided on outer surface of the frame portion 222 in the Y-axis direction. That is, the frame portion 222 constitutes an electrode support portion that supports the movable comb-tooth electrode 286. The movable comb-tooth electrode 286 includes a plurality of movable comb-teeth 286a which extend along a plane perpendicular to the X-axis direction. The movable comb-teeth 286a are aligned in the X-axis direction with a predetermined gap.

In the fixed comb-tooth electrode 285 and the movable comb-tooth electrode 286, the plurality of fixed comb-teeth 285a and the plurality of movable comb-teeth 286a are alternately arranged. That is, each of the fixed comb-teeth 285a of the fixed comb-tooth electrode 285 is located between the movable comb-teeth 286a of the movable comb-tooth electrode 286. In the fixed comb-tooth electrode 285 and the movable comb-tooth electrode 286, the fixed comb-teeth 285a and the movable comb-teeth 286a, which are adjacent to each other, face each other in the X-axis direction. For example, a distance between the fixed comb-tooth 285a and the movable comb-tooth 286a which are adjacent to each other is approximately several µm.

In FIG. 11, connection positions C1 between the frame portion 222 and the second torsion bars 267, and connection positions C3 between the movable unit 22b and the second torsion bars 267 are illustrated. As described above, in a case where the frame portion 222 and the second torsion bar 267 are connected to each other via another element (the bracket 225 in the first modification example), the connection position C1 is a position at which the frame portion 222 and the other element are connected to each other. For example, the connection position C3 is a position at which the bracket 225 and the second torsion bar 267 are connected to each other. The maximum width W1 of the light passage opening 24 in the Y-axis direction is greater than a distance D1 between the connection positions C1 in the Y-axis direction. In addition, the maximum width W1 is greater than a distance D11 between the connection positions C3 in the Y-axis direction.

In addition, in FIG. 11, connection positions C2 between the frame portion 222 and the second torsion bars 277, and connection positions C4 between the movable unit 22b and the second torsion bars 277 are illustrated. As described above, in a case where the frame portion 222 and the second torsion bar 277 are connected to each other via another element (the bracket 226 in the first modification example), the connection position C2 is a position at which the frame portion 222 and the other element are connected to each other. For example, the connection position C4 is a position at which the bracket 225 and the second torsion bar 277 are connected to each other. The maximum width W2 of the light passage opening 25 in the Y-axis direction is greater than the distance D6 between the connection positions C2 in the Y-axis direction. In addition, the maximum width W2 is greater than a distance D12 between the connection positions C4 in the Y-axis direction.

In the first modification example, the miniaturization of the entirety of a device, the improvement of the external force resistance of the first elastic support unit 26 and the second elastic support unit 27, and the securement of the optical performance are also realized in a similar manner as in the above-described embodiment.

Figure 12:
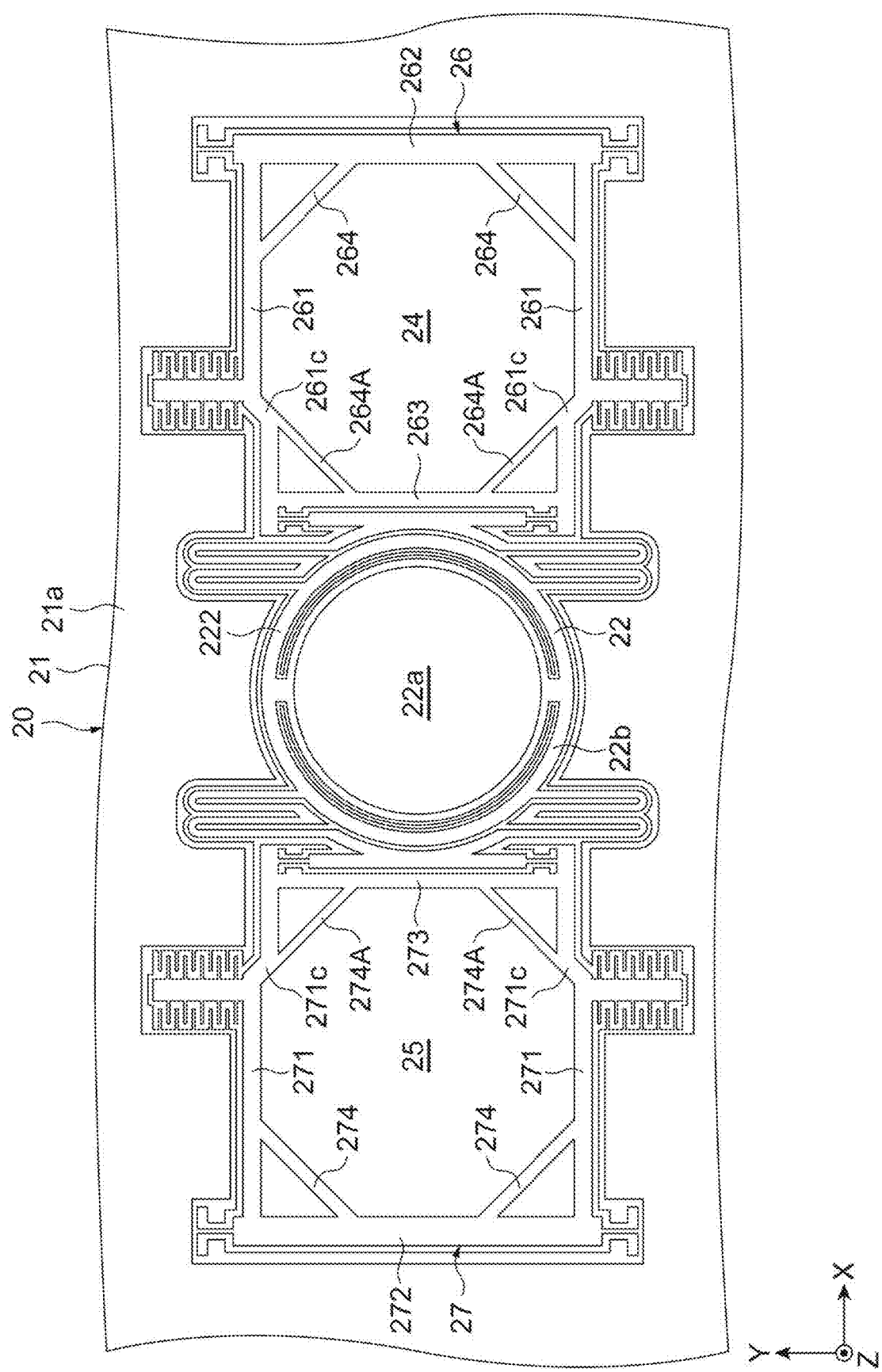
FIG. 12 is a plan view of a mirror device of a second modification example.

The mirror device 20 may have a configuration similar to a second modification example illustrated in FIG. 12. In the second modification example, the first elastic support unit 26 further includes a pair of beam members 264A. The pair of beam members 264A respectively bridge the third portions 261c of the pair of levers 261 and the second link member 263. The respective beam members 264A have a plate shape that extends along a plane perpendicular to the Z-axis direction. The pair of beam members 264A obliquely extend to be spaced away from each other as going away from the movable mirror 22. The pair of beam members 264A define the light passage opening 24 in combination with the pair of levers 261, the first link member 262, the second link member 263, and the pair of beam members 264.

The second elastic support unit 27 further includes a pair of beam members 274A. The pair of beam members 274A respectively bridge third portions 271c of the pair of levers 271 and the second link member 273. The respective beam members 274A have a plate shape that extends along a plane perpendicular to the Z-axis direction. The pair of beam members 274A obliquely extend to be spaced away from each other as going away from the movable mirror 22. The pair of beam members 274A define the light passage opening 25 in combination with the pair of levers 271, the first link member 272, the second link member 273, and the pair of beam members 274.

In the second modification example, the miniaturization of the entirety of a device, the improvement of the external force resistance of the first elastic support unit 26 and the second elastic support unit 27, and the securement of the optical performance are also realized in a similar manner as in the above-described embodiment. In addition, since the first elastic support unit 26 and the second elastic support unit 27 include the beam member 264A and the beam member 274A, respectively, it is possible to further improve the external force resistance of the first elastic support unit 26 and the second elastic support unit 27.

The first elastic support unit 26 may have a configuration similar to a third modification example illustrated in FIG. 13(a). In the third modification example, the first elastic support unit 26 does not include the pair of beam members 264 and the pair of non-linearity mitigation springs 268. In FIG. 13(a), the electrode support portion 269 is not illustrated. The pair of levers 261, the first link member 262, and the second link member 263 have a circular ring shape as a whole when viewed from the Z-axis direction. That is, each of the pair of levers 261, the first link member 262, and the second link member 263 extends in a state of being curved to form a circular arc shape. In FIG. 13(a), a boundary between the pair of levers 261, the first link member 262, and the second link member 263 is indicated by two-dot chain line. The light passage opening 24 has a circular shape when viewed from the Z-axis direction.

A bracket 261g is provided in the first end 261d of each of the levers 261, and the lever 261 is connected to each of the first torsion bars 266 at the bracket 261g. A bracket 261h is provided in the second end 261e of each of the levers 261, and the lever 261 is connected to each of the second torsion bars 267 at the bracket 261h. In FIG. 13(a), the second elastic support unit 27 is omitted, but in the third modification example, the second elastic support unit 27 may also be configured in a similar manner as in the first elastic support unit 26.

In the third modification example, the miniaturization of the entirety of a device, the improvement of the external force resistance of the first elastic support unit 26 and the second elastic support unit 27, and the securement of the optical performance are also realized in a similar manner as in the above-described embodiment. That is, as illustrated in FIG. 13(a), the pair of levers 261 may face each other in the Y-axis direction, and each of the levers 261 may include at least a portion (component) that extends in the X-axis direction. The first link member 262 and the second link member 263 may bridge the pair of levers 261, and may include at least a portion (component) that extends along the Y-axis direction.

The first elastic support unit 26 may have a configuration similar to a fourth modification example illustrated in FIG. 13(b). In the fourth modification example, the first elastic support unit 26 does not include the pair of beam members 264 and the pair of non-linearity mitigation springs 268, and further includes a pair of first torsion bars 266A. In FIG. 13(b), the electrode support portion 269 is not illustrated. The pair of first torsion bars 266A are connected between the pair of levers 261 and the base 21, respectively. One of the first torsion bars 266A is connected to one of the levers 261 on a side opposite to one of the first torsion bars 266, and the other first torsion bar 266A is connected to the other lever 261 on a side opposite to the other first torsion bar 266. The pair of first torsion bars 266 and the pair of first torsion bars 266A are disposed on the same central line parallel to the Y-axis direction. In this manner, a first torsion support portion may include at least a pair of torsion support portions (torsion bars). The first elastic support unit 26 may not include the pair of first torsion bars 266, and may include only the pair of first torsion bars 266A.

The pair of levers 261 extend in the X-axis direction. The first link member 262 and the second link member 263 extend in the Y-axis direction. The light passage opening 24 has a rectangular shape when viewed from the Z-axis direction. In FIG. 13(b), the second elastic support unit 27 is omitted, but in the fourth modification example, the second elastic support unit 27 may also be configured in a similar manner as in the first elastic support unit 26. In the third modification example, the miniaturization of the entirety of a device, the improvement of the external force resistance of the first elastic support unit 26 and the second elastic support unit 27, and the securement of the optical performance are also realized in a similar manner as in the above-described embodiment.

In the above-described embodiment and respective modification examples, materials and shapes of respective configurations are not limited to the above-described materials and shapes, and various materials and shapes can be employed. For example, each of the arrangement portion 221 and the mirror surface 22a may have any shape such as a rectangular shape and an octagonal shape when viewed from the Z-axis direction. The frame portion 222 may have any ring shape such as a rectangular ring shape and an octagonal ring shape when viewed from the Z-axis direction. Each of the light passage opening 24 and the light passage opening 25 may have any shape such as a circular shape and an octagonal shape when viewed from the Z-axis direction. The mirror device 20 may be constituted by a semiconductor substrate other than the SOI substrate, and may be constituted, for example, by a substrate formed of silicon only.

Each of the inner beam portion 224a, the outer beam portion 224b, and the connection beam portion 224c may be formed in any shape. For example, the beam portions may extend obliquely with respect to X-axis direction or the Y-axis direction, or may extend in a zigzag shape. The arrangement, the number, the length, the width, and the thickness of the beam portions may be arbitrarily set. For example, the thicknesses of the inner beam portion 224a, the outer beam portion 224b, and the connection beam portion 224c may be different from each other. At least one of the beam portions may be omitted. The thickness of the support layer 101 that constitutes the beam portion 224 may be the same as the thickness of the support layer 101 that constitutes the base 21. The shape of the first torsion bars 266 and 276 and the second torsion bars 267 and 277 is not limited and may be any shape such as a rod shape. The mirror surface 22a may be disposed on a surface of the device layer 102, which constitutes the movable unit 22b, on a side opposite to the intermediate layer 103. In this case, for example, in the support layer 101 that constitutes the base 21, the surface on a side opposite to the intermediate layer is joined to the third surface 13a of the optical function member 13. The second surface 21b of the base 21 and the third surface 13a of the optical function member 13 may be joined to each other with means (for example, an adhesive such as a UV-curable resin) other than the direct bonding. In a case where the fixed mirror 16 is disposed on a side opposite to the mirror device 20 with respect to the optical function member 13, the fixed mirror 16 may be separated from the fourth surface 13b of the optical function member 13.

The first elastic support unit 26 may not include the second link member 263. In this case, for example, the light passage opening 24 is defined by the pair of levers 261, the first link member 262, the pair of beam members 264, the intermediate member 265, and the second torsion bars 267. Similarly, the second elastic support unit 27 may not include the second link member 273. The connection position B1 between the lever 261 and the first link member 262 may be located on the movable mirror 22 side with respect to the connection position A1 between the lever 261 and the first torsion bar 266, or may be located on a side opposite to the movable mirror 22 with respect to the connection position A1. Similarly, the connection position B3 between the lever 271 and the first link member 272 may be located on the movable mirror 22 side with respect to the connection position A3 between the lever 271 and the first torsion bar 276, or may be located on a side opposite to the movable mirror 22 with respect to the connection position A3. At least one of the first link member 262, the second link member 263, the first torsion bar 266, and the second torsion bar 267 may be connected to the lever 261 at a position other than an end. Similarly, at least one of the first link member 272, the second link member 273, the first torsion bar 276, and the second torsion bar 277 may be connected to the lever 271 at a position other than an end.

The optical device of the present disclosure is not limited to the mirror device, and may be an optical device in which another optical function unit other than the mirror surface 22a is disposed on the movable unit 22b. Examples of the other optical function unit include a lens. The drive unit 23 of the mirror device 20 may include three or more elastic support portions which elastically support the movable mirror 22. The actuator unit 28 is not limited to the electrostatic actuator, and may be, for example, a piezoelectric type actuator, an electromagnetic type actuator, or the like. The mirror device 20 is not limited to constitute the FTIR, and may constitute another optical system. The respective configurations in one embodiment or one modification example as described above can be applied to respective configurations in other embodiments or modification examples.

REFERENCE SIGNS LIST

20: mirror device (optical device), 21: base, 21a: first surface (main surface), 21b: second surface (main surface), 22a: mirror surface (optical function unit), 22b: movable unit, 221: arrangement portion, 222: frame portion, 24: light passage opening, 25: light passage opening, 26: first elastic support unit, 27: second elastic support unit, 261, 271: lever, 261d, 271d: first end, 261e, 271e: second end, 262, 272: first link member, 263, 273: second link member, 264, 274: beam member, 266, 276: first torsion bar (first torsion support portion), 267, 277: second torsion bar (second torsion support portion), T1, T2: center, W1, W2: maximum width.

The invention claimed is:

1. An optical device comprising:
a base that includes a main surface;
a movable unit;
an optical function unit that is disposed on the movable unit; and
an elastic support unit that is connected between the base and the movable unit, and supports the movable unit so that the movable unit is capable of moving along a first direction perpendicular to the main surface,
wherein the elastic support unit includes,
a pair of levers which face each other in a second direction perpendicular to the first direction,
a pair of first torsion support portions which extend in the second direction and are respectively connected between the pair of levers and the base,
a pair of second torsion support portions which extend in the second direction and are respectively connected between the pair of levers and the movable unit, and
a first link member that bridges the pair of levers,
the pair of levers and the first link member define a light passage opening,
each of connection positions between the pair of levers and the pair of first torsion support portions is located on a side opposite to the movable unit with respect to the center of the light passage opening in a third direction perpendicular to the first direction and the second direction, and
a maximum width of the light passage opening in the second direction is defined by a gap between the pair of levers in the second direction.

2. The optical device according to claim 1,
wherein the elastic support unit further includes a second link member that bridges the pair of levers, and
the light passage opening is defined by the pair of levers, the first link member, and the second link member.

3. The optical device according to claim 1,
wherein the elastic support unit further includes a pair of beam members which respectively bridge the pair of levers and the first link member.

4. The optical device according to claim 1,
wherein the pair of first torsion support portions are respectively connected to first ends of the pair of levers, and the pair of second torsion support portions are respectively connected to second ends of the pair of lever.

5. The optical device according to claim 1,
wherein the maximum width of the light passage opening in the second direction is greater than a distance between connection positions between the movable unit and the pair of second torsion support portions in the second direction.

6. The optical device according to claim 1,
wherein the movable unit includes an arrangement portion in which the optical function unit is disposed and a frame portion that surrounds the arrangement portion when viewed from the first direction, and
the maximum width of the light passage opening in the second direction is greater than a distance between connection positions of the frame portion and the pair of second torsion support portions in the second direction.

7. The optical device according to claim 1,
wherein in each of the pair of levers, a distance from a connection position with the first link member to a connection position with the pair of second torsion support portions in the third direction is longer than a distance from a connection position with the first link member to a connection position with the pair of first torsion support portions in the third direction.

8. The optical device according to claim 1,
wherein the optical function unit is a mirror surface, and when viewed from the first direction, an area of the light passage opening is 50% or greater of an area of the mirror surface.

\* \* \* \* \*